(12) United States Patent
Kim et al.

(10) Patent No.: US 9,806,063 B2
(45) Date of Patent: Oct. 31, 2017

(54) REINFORCED WAFER LEVEL PACKAGE COMPRISING A CORE LAYER FOR REDUCING STRESS IN A SOLDER JOINT AND IMPROVING SOLDER JOINT RELIABILITY

(71) Applicant: QUALCOMM Incorporated, San Diego, CA (US)

(72) Inventors: Chin-Kwan Kim, San Diego, CA (US); Rajneesh Kumar, San Diego, CA (US); Vladimir Noveski, San Diego, CA (US); Jie Fu, San Diego, CA (US); Ahmer Raza Syed, Chandler, AZ (US); Milind Pravin Shah, San Diego, CA (US); Omar James Bchir, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/699,863

(22) Filed: Apr. 29, 2015

(65) Prior Publication Data
US 2016/0322332 A1 Nov. 3, 2016

(51) Int. Cl.
*H01L 23/48* (2006.01)
*H01L 25/065* (2006.01)
(Continued)

(52) U.S. Cl.
CPC .......... *H01L 25/0657* (2013.01); *H01L 21/56* (2013.01); *H01L 21/768* (2013.01);
(Continued)

(58) Field of Classification Search
CPC ... H01L 25/0657; H01L 21/56; H01L 21/768; H01L 23/3114; H01L 23/49838; H01L 23/49894; H01L 23/5226
(Continued)

(56) References Cited

U.S. PATENT DOCUMENTS 7,105,931 B2   9/2006   Attarwala
7,129,117 B2  10/2006   Hsu
(Continued)

OTHER PUBLICATIONS

International Search Report and Written Opinion—PCT/US2016/029887—ISA/EPO—dated Sep. 16, 2016.
(Continued)

*Primary Examiner* — Hung Vu
(74) *Attorney, Agent, or Firm* — Loza & Loza, LLP/Qualcomm

(57) ABSTRACT

Some features pertain to a package that includes a redistribution portion, a first die coupled to the redistribution portion, a core layer coupled to the redistribution portion, and an encapsulation layer encapsulating the first die and the core layer. The redistribution portion includes a first dielectric layer. The core layer has a higher Young's Modulus than the encapsulation layer. In some implementations, the core layer includes a glass fiber (e.g., core layer is a glass reinforced dielectric layer). In some implementations, the core layer has a Young's Modulus of about at least 15 gigapascals (Gpa). In some implementations, the first die includes a front side and a back side, where the front side of the first die is coupled to the redistribution portion. In some implementations, the first dielectric layer is a photo imageable dielectric (PID) layer.

23 Claims, 24 Drawing Sheets

(51) Int. Cl.
*H01L 23/16* (2006.01)
*H01L 23/31* (2006.01)
*H01L 23/00* (2006.01)
*H01L 25/10* (2006.01)
*H01L 21/768* (2006.01)
*H01L 23/498* (2006.01)
*H01L 23/522* (2006.01)
*H01L 21/56* (2006.01)
*H01L 23/538* (2006.01)

(52) U.S. Cl.
CPC .......... *H01L 23/16* (2013.01); *H01L 23/3114* (2013.01); *H01L 23/3135* (2013.01); *H01L 23/49838* (2013.01); *H01L 23/49894* (2013.01); *H01L 23/5226* (2013.01); *H01L 24/19* (2013.01); *H01L 24/20* (2013.01); *H01L 24/96* (2013.01); *H01L 24/97* (2013.01); *H01L 25/105* (2013.01); *H01L 21/568* (2013.01); *H01L 23/49816* (2013.01); *H01L 23/49827* (2013.01); *H01L 23/5389* (2013.01); *H01L 2224/04105* (2013.01); *H01L 2224/12105* (2013.01); *H01L 2224/16227* (2013.01); *H01L 2224/32225* (2013.01); *H01L 2224/48091* (2013.01); *H01L 2224/48227* (2013.01); *H01L 2224/48235* (2013.01); *H01L 2224/73265* (2013.01); *H01L 2225/0651* (2013.01); *H01L 2225/06548* (2013.01); *H01L 2225/06572* (2013.01); *H01L 2225/1035* (2013.01); *H01L 2225/1041* (2013.01); *H01L 2225/1058* (2013.01); *H01L 2924/14* (2013.01); *H01L 2924/1431* (2013.01); *H01L 2924/1434* (2013.01); *H01L 2924/15311* (2013.01); *H01L 2924/18162* (2013.01)

(58) Field of Classification Search
USPC ........................ 257/686, 690, 774, 777, 788
See application file for complete search history.

(56) References Cited

U.S. PATENT DOCUMENTS

| | | | |
|---|---|---|---|
| 7,829,992 | B2 | 11/2010 | Sugino et al. |
| 8,299,595 | B2 | 10/2012 | Yoon et al. |
| 2009/0250803 | A1 | 10/2009 | Arai |
| 2010/0097770 | A1 | 4/2010 | Park et al. |
| 2012/0018871 | A1* | 1/2012 | Lee .................. H01L 25/0655 257/698 |
| 2016/0043041 | A1* | 2/2016 | Yang ................ H01L 21/76885 257/669 |

OTHER PUBLICATIONS

Partial International Search Report—PCT/US2016/029887—ISA/EPO—dated Jul. 21, 2016.

* cited by examiner

REINFORCED WAFER LEVEL PACKAGE COMPRISING A CORE LAYER FOR REDUCING STRESS IN A SOLDER JOINT AND IMPROVING SOLDER JOINT RELIABILITY

BACKGROUND

Field

Various features relate to a reinforced wafer level package that includes a core layer for reducing stress in a solder joint and improving solder joint reliability.

Background

FIG. 1 illustrates a fan-out wafer level package 100 that includes a die 102, a redistribution portion 104, and an encapsulation layer 108. The die 102 is coupled to the redistribution portion 104. The encapsulation layer 108 encapsulates the die 102. The redistribution portion 104 includes a dielectric layer 140 and several interconnects 141. The interconnects 141 are located in the dielectric layer 140. The interconnects 141 are coupled to the die 102. A solder ball 150 is coupled to the interconnects 141. The fan-out wafer level package 100 may be coupled to a printed circuit board (PCB) (not shown) through the solder ball 150.

Fan-out wafer level packages provide lower cost and smaller sizes relative to other packages. However, the smaller sizes of the fan-out wafer level package combined with bigger die sizes can cause solder ball reliability between the fan-out wafer level packages and the PCB to which they are mounted on. Solder ball reliability of a fan-out wafer level package can be affected by the amount of stress that is applied on the fan-out wafer level package and transferred to the solder ball.

Therefore, there is a need for a device (e.g., fan-out wafer level package, package on package (PoP) device) with more reliable solder joints (e.g., longer life expectancy solder joints) to ensure better quality and/or performance signals to/from packages. Such a device can reduce and/or minimize the amount of stress that is transferred to solder joints. Ideally, such a device will have a better form factor, be cheaper to fabricate, while at the same time meeting the needs and/or requirements of mobile and/or wearable devices.

SUMMARY

Various features relate to a reinforced wafer level package that includes a core layer for reducing stress in a solder joint and improving solder joint reliability.

A first example provides a package that includes a redistribution portion, a first die coupled to the redistribution portion, a core layer coupled to the redistribution portion; and an encapsulation layer encapsulating the first die and the core layer. The redistribution portion includes a first photo imageable dielectric (PID) layer and a first interconnect. The first die is coupled to the first interconnect of the redistribution portion.

A second example provides a package on package (PoP) device that includes a first package and a second package coupled to the first package. The second package includes a redistribution portion, a first die coupled to the redistribution portion, a core layer coupled to the redistribution portion, a via traversing the core layer, an encapsulation layer encapsulating the first die and the core layer, and a second interconnect in the encapsulation layer, where the second interconnect is coupled to the via. The redistribution portion includes a first photo imageable dielectric (PID) layer, and a first interconnect. The first die is coupled to the first interconnect of the redistribution portion.

A third example provides a method for fabricating a package. The method provides a core layer. The method provides a first die. The method forms an encapsulation layer on the core layer and the first die. The method forms a redistribution portion on the core layer and the first die, where forming the redistribution portion includes forming a first photo imageable dielectric (PID) layer, and forming a first interconnect.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some features pertain to a package that includes a redistribution portion, a first die coupled to the redistribution portion, a core layer coupled to the redistribution portion, and an encapsulation layer encapsulating the first die and the core layer. The redistribution portion includes a first dielectric layer. The core layer has a higher Young's Modulus than the encapsulation layer. In some implementations, the core layer includes a glass fiber (e.g., core layer is a glass reinforced dielectric layer). In some implementations, the core layer has a Young's Modulus of about at least 15 gigapascals (Gpa). In some implementations, the first die includes a front side and a back side, where the front side of the first die is coupled to the redistribution portion. In some implementations, the first dielectric layer is a photo imageable dielectric (PID) layer.

In some implementation, an interconnect is an element or component of a device (e.g., integrated device, integrated device package, die) and/or a base (e.g., package substrate, printed circuit board, interposer) that allows or facilitates an electrical connection between two points, elements and/or components. In some implementations, an interconnect may include a trace, a via, a pad, a pillar, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Exemplary Reinforced Fan-Out Wafer Level Package Comprising a Core Layer

Figure 1:
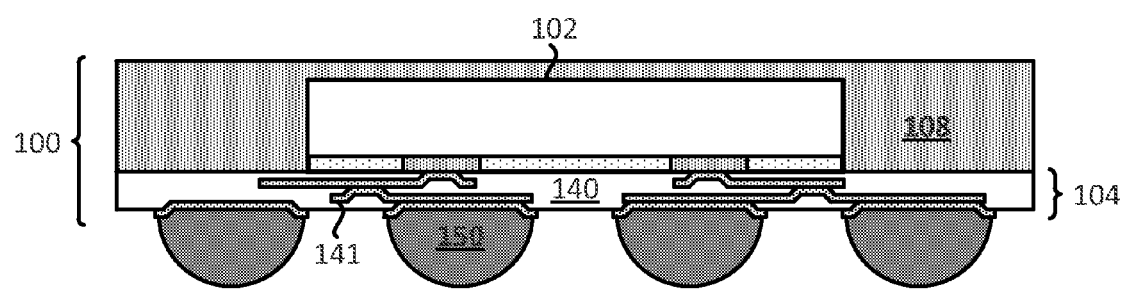
FIG. 1 illustrates a fan-out wafer level package.
Figure 2:
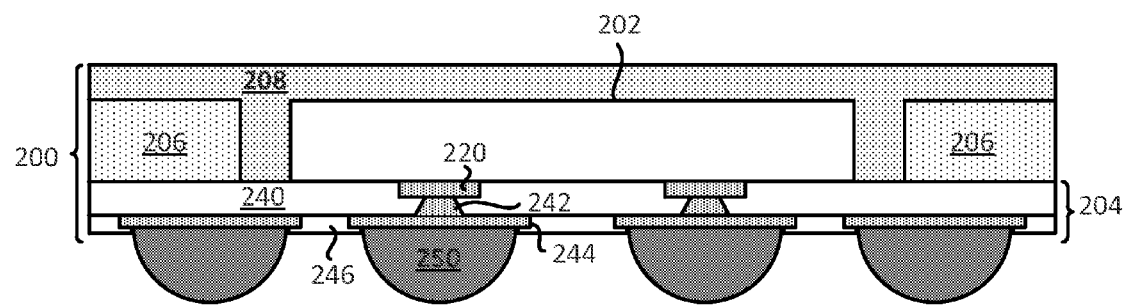
FIG. 2 illustrates an example of a package with a core layer.

FIG. 2 illustrates a package 200 that includes a core layer for reducing the stress on solder joints in the package 200. The package 200 may be a reinforced fan-out wafer level package. The package 200 may be an integrated circuit device package. The package 200 includes a first die 202, a redistribution portion 204, a core layer 206, and an encapsulation layer 208. A die (e.g., first die 202) may be an integrated circuit (IC) that includes several transistors and/or other electronic components. The first die 202 may be a logic die and/or a memory die. The first die 202 may be a bare die. The first die 202 may also include a first pad 220.

The first die 202 is coupled to the redistribution portion 204. The core layer 206 is coupled to the redistribution portion 204. The encapsulation layer 208 encapsulates at least part of the first die 202, and at least part of the core layer 206. In some implementations, the core layer 206 is used to reinforce the package 200. In some implementations, the core layer 206 is configured to help reduce the stress on solder joints in the package 200, which in turn, increases the life expectancy and reliability of the solder joints (e.g., solder ball 250) of the package 200.

The first die 202 has a front side (e.g., active side) and a back side. The front side of the first die 202 may include the first pad 220. FIG. 2 illustrates that the front side of the first die 202 is coupled to the redistribution portion 204. The back side of the first die 202 is encapsulated by the encapsulation layer 208. In some implementations, the back side of the first die 202 may be exposed and not encapsulated by the encapsulation layer 208.

The core layer 206 is located laterally to the first die 202 in the package 200. In some implementations, the core layer 206 may laterally surround the first die 202. The core layer 206 is made of a different material than the encapsulation layer 208. The different materials that can be used for the core layer 206 and/or the encapsulation layer 208, as well as exemplary properties for these materials, are further described below.

The redistribution portion 204 includes a dielectric layer 240, a first interconnect 242 (e.g., first via), a second interconnect 244 (e.g., first pad, first trace), and a solder resist layer 246. In some implementations, the dielectric layer 240 is a photo-imageable dielectric (PID) layer. A photo imageable dielectric layer is a dielectric layer that can be patterned through a lithography process (e.g., by exposing the dielectric layer to a light source). In some implementations, the dielectric layer 240 may include several dielectric layers. The dielectric layer 240, which may be a photo imageable dielectric layer, is coupled to the front side of the first die 202.

FIG. 2 illustrates that the first interconnect 242 is coupled to the first pad 220. The first interconnect 242 is also coupled to the second interconnect 244. The second interconnect 244 is coupled to the solder ball 250.

In some implementations, the interconnects in the redistribution portion 204 may have a pitch of about 30 microns ($\mu m$) or less (e.g., L/S 15/15 microns or less, where L is line width and S is spacing). In some implementations, the use of a photo-imageable dielectric (PID) layer allows for interconnects (e.g., vias) with substantially lower diameters. In some implementations, vias in a photo-imageable dielectric (PID) layer may have a diameter of about 30 microns ($\mu m$) or less. For example, the first interconnect 242 (e.g., first via), which is formed in the dielectric layer 240, may have a diameter of about 30 microns ($\mu m$) or less. In some implementations, vias in a non-photo-imageable dielectric (PID) layer (e.g., prepeg layer, encapsulation layer, core layer), may have a diameter of about 40 microns ($\mu m$) or greater.

Figure 3:
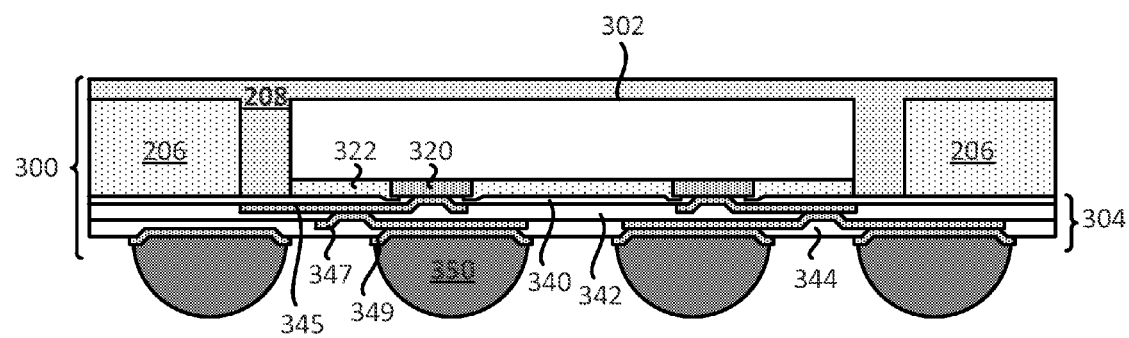
FIG. 3 illustrates another example of a package with a core layer.

Different implementations of a reinforced package may have different configurations and/or designs. FIG. 3 illustrates an example of another package 300 that includes a core layer for reducing the stress on solder joints in the package 300. The package 300 is similar to the package 200 of FIG. 2, except that the redistribution portion of the package 300 has a different design than the redistribution portion 204 of the package 200.

The package 300 may be a reinforced wafer level package. The package 300 may be an integrated circuit device package. The package 300 includes a first die 302, a redistribution portion 304, the core layer 206, and the encapsulation layer 208. A die (e.g., first die 302) may be an integrated circuit (IC) that includes several transistors and/or other electronic components. The first die 302 may be a logic die and/or a memory die. The first die 302 may be a bare die. The first die 302 may also include a first pad 320 and a passivation layer 322.

The first die 302 has a front side (e.g., active side) and a back side. The front side of the first die 302 may include the first pad 320 and the passivation layer 322. FIG. 3 illustrates that the front side of the first die 302 is coupled to the redistribution portion 304. The back side of the first die 302 is encapsulated by the encapsulation layer 208. In some implementations, the back side of the first die 302 may be exposed and not encapsulated by the encapsulation layer 208.

As mentioned above, the core layer 206 is used to reinforce the package 300. In some implementations, the core layer 206 is configured to help reduce the stress on solder joints in the package 300, which in turn, increases the life expectancy and reliability of the solder joints (e.g., solder ball 350) of the package 300.

The redistribution portion 304 includes a first dielectric layer 340, a second dielectric layer 342, a third dielectric layer 344, a first interconnect 345 (e.g., first redistribution interconnect), a second interconnect 347 (e.g., second redistribution interconnect), and a third interconnect 349 (e.g., under bump metallization (UBM) layer). In some implementations, one or more of the dielectric layers (e.g., first dielectric layer 340) may be a photo-imageable dielectric (PID) layer. The first dielectric layer 340, which may be a photo imageable dielectric layer, is coupled to the front side of the first die 302. More specifically, the first dielectric layer 340 may be coupled to the passivation layer 322 of the first die 302.

In some implementations, the interconnects in the redistribution portion 304 may have a pitch of about 30 microns (μm) or less (e.g., L/S 15/15 microns or less, where L is line width and S is spacing). In some implementations, the use of a photo-imageable dielectric (PID) layer allows for interconnects (e.g., vias) with substantially lower diameters. In some implementations, vias in a photo-imageable dielectric (PID) layer may have a diameter of about 30 microns (μm) or less. In some implementations, vias in a non-photo-imageable dielectric (PID) layer (e.g., prepeg layer, encapsulation layer, core layer), may have a diameter of about 40 microns (μm) or greater.

The first interconnect 345 is coupled to the first pad 320. The first interconnect 345 is also coupled to the second interconnect 347. The second interconnect 347 is coupled to the third interconnect 349. A solder ball 350 is coupled to the third interconnect 349. Different implementations may use a different number of redistribution layers (e.g., redistribution interconnects). For example, a redistribution portion may include one or more redistribution layers. FIG. 3 illustrates interconnects (e.g., first interconnect 345) in the redistribution portion 304 with different shapes than the interconnects (e.g., first interconnect 242) in the redistribution portion 204 of FIG. 2.

Figure 4:
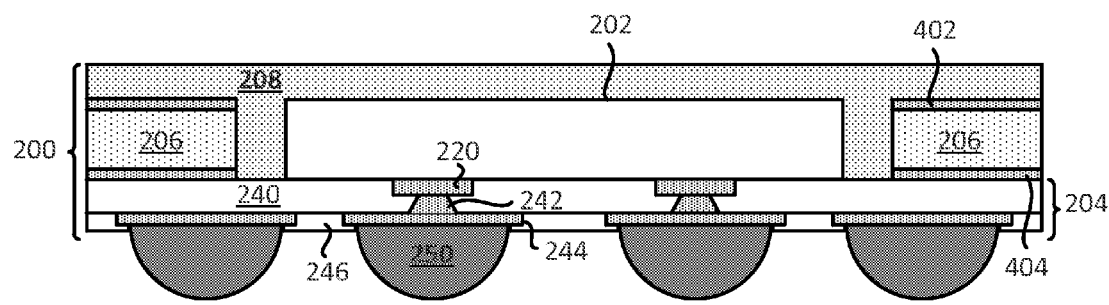
FIG. 4 illustrates an example of a package with a core layer.
Figure 5:
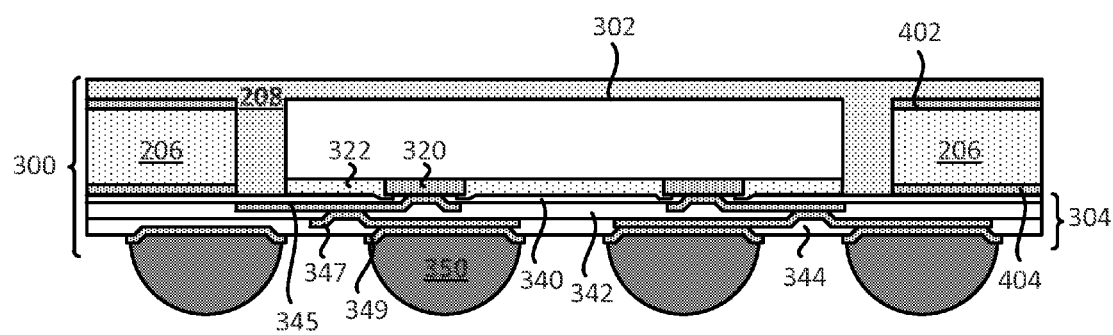
FIG. 5 illustrates another example of a package with a core layer.

FIGS. 4-5 illustrate examples of packages with a different core layer. As shown in FIGS. 4-5, a first metal layer 402 (e.g., first core layer) is on a first surface of the core layer 206, and a second metal layer 404 (e.g., second core layer) is on a second surface of the core layer 206. The first metal layer 402 and the second metal layer 404 may provide additional stiffness to the respective packages.

It is noted that the packages (e.g., package 200, package 300) shown in FIGS. 2-5 may be standalone, or they may be packages that are implemented in a package on package (PoP) device. For example, the package 200 may be a bottom package in a package on package (PoP) device. Examples of various package on package (PoP) devices are illustrated and described below in FIGS. 17-18.

Exemplary Materials

As mentioned above, the core layer 206 and the encapsulation layer 208 may be made of different materials. Similarly, the dielectric layers (e.g., first dielectric layer 240, first dielectric layer 340) may also be made of different materials.

In some implementations, the core layer 206 is a glass fiber reinforced core layer (e.g., glass fiber reinforced dielectric layer). The encapsulation layer 208 may be a prepeg layer, a mold, an epoxy fill, an Ajinomoto Build-up Film (ABF) or similar material, and/or a glass fiber reinforced ABF (Ajinomoto Build-Up Film) or similar material. The dielectric layers may be a photo imageable dielectric (PID) layer and/or prepeg layer.

In some implementations, to provide effective stress reduction in the package (e.g., package 200, package 300), the materials of the core layer 206, the encapsulation layer 208 and/or dielectric layers may be selected from a group of materials comprising specific properties and/or characteristics.

One property of a material to consider is the stiffness of the material, which can be expressed as Young's Modulus (E). A first material with a higher Young's Modulus (E) than a second material means that the first material is a stiffer material than the second material. In some implementations, the materials used for the core layer 206 and the encapsulation layer 208 are selected such that the Young's Modulus for the core layer 206 is greater than the Young's Modulus for the encapsulation layer 208. For example, the core layer may have a first Young's Modulus, and the encapsulation layer may have a second Young's Modulus, where the first Young's Modulus is greater than the second Young's Modulus.

In some implementations, the core layer 206 may have a Young's Modulus that is greater than about 15 gigapascals (Gpa). In some implementations, the core layer 206 may have a Young's Modulus that is in the range of about 15-40 gigapascals (Gpa).

In some implementations, the encapsulation layer 208 may have a Young's Modulus that is less than about 15 gigapascals (Gpa) The gigapascals (Gpa) values are values corresponding to room temperature.

Another property of a material to consider is the coefficient of thermal expansion (CTE) of the material. Since the package may be coupled (e.g., mounted on) to a printed circuit board (PCB), the materials of the package may be selected so that the effective CTE of the package is as close as possible to the effective CTE of the PCB to which it is coupled to (e.g., mounted on). A substantial mismatch or substantial difference in CTEs between the package and the PCB can cause warpage and stress on the package and/or the solder joints, which can cause a break in the solder joints (e.g., cause an open solder joint).

In some implementations, the encapsulation layer 208 may have a coefficient of thermal expansion (CTE) that is greater than about 20 parts per million per degree Celsius (ppm/C). In some implementations, the encapsulation layer 208 may have a coefficient of thermal expansion (CTE) that is in the range of about 20-50 parts per million per degree Celsius (ppm/C).

In some implementations, the core layer 206 may have a coefficient of thermal expansion (CTE) that is less than about 12 parts per million per degree Celsius (ppm/C). The ppm/C values are values corresponding to room temperature.

Figure 6A:
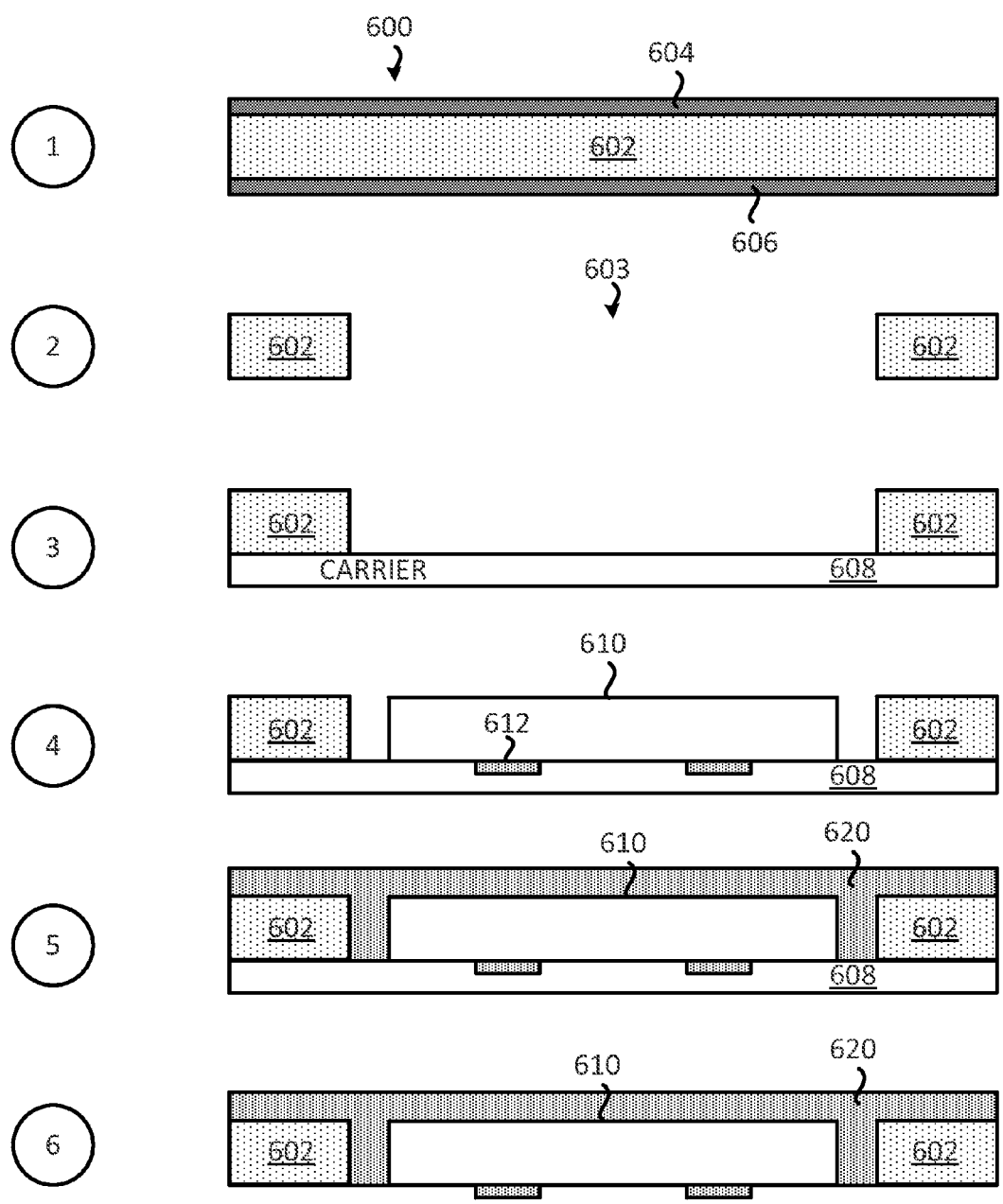
FIG. 6 (which comprises FIGS. 6A-6B) illustrates an example of a sequence for fabricating a package with a core layer.
Figure 6B:
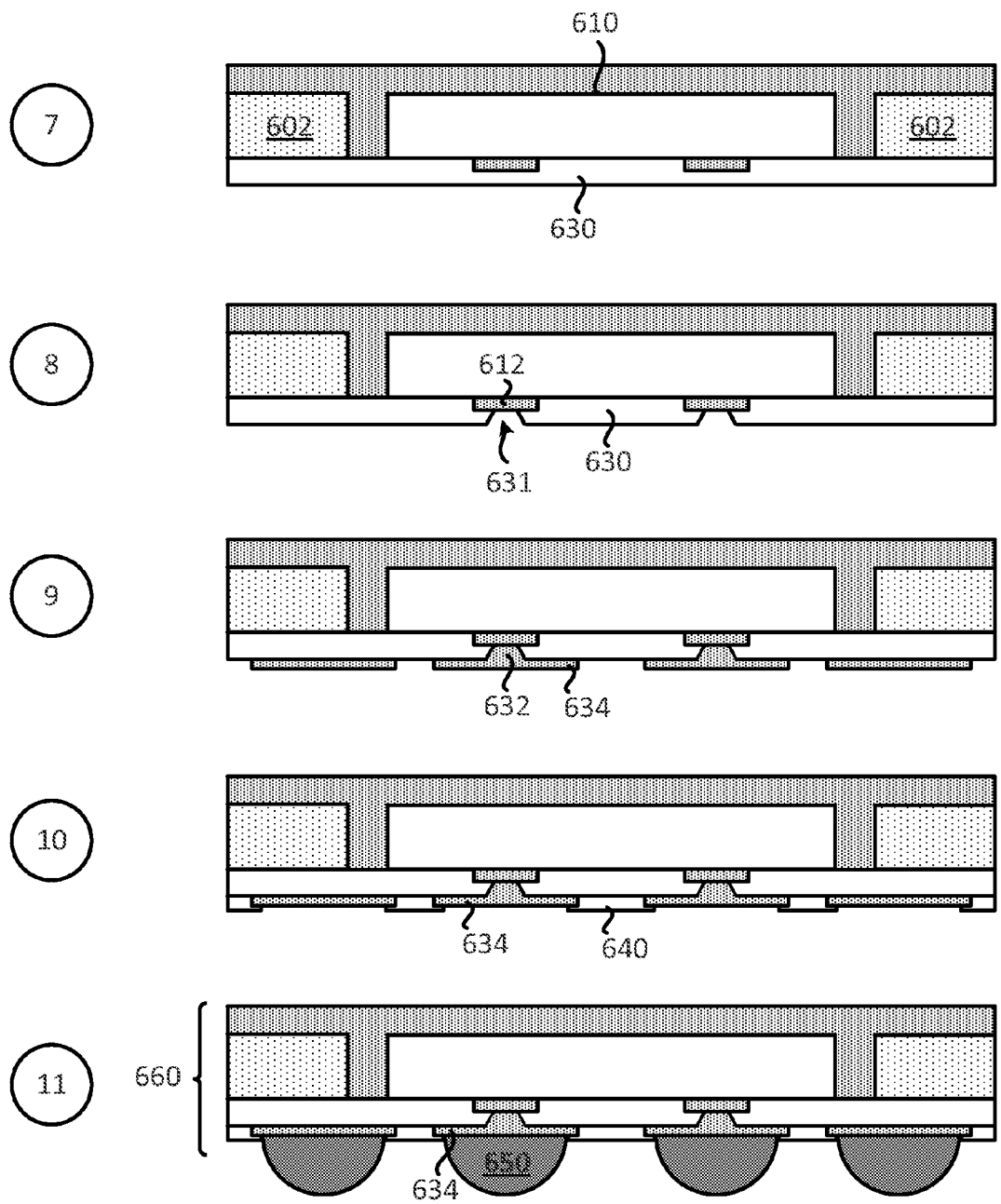

Exemplary Sequence for Fabricating a Reinforced Fan-Out Wafer Level Package Comprising a Core Layer In some implementations, providing/fabricating a reinforced wafer level a package that includes a core layer includes several processes. FIG. 6 (which includes FIGS. 6A-6B) illustrates an exemplary sequence for providing/fabricating a reinforced fan-out level package that includes a core layer. In some implementations, the sequence of FIG.

6 may be used to provide/fabricate the packages of FIGS. 2-5 and/or other packages described in the present disclosure. However, for the purpose of simplification, FIG. 6 will be described in the context of providing/fabricating the package of FIG. 2.

It should be noted that the sequence of FIG. 6 may combine one or more stages in order to simplify and/or clarify the sequence for providing a package. In some implementations, the order of the processes may be changed or modified.

Stage 1, as shown in FIG. 6A, illustrates a state after a core substrate 600 that is provided. The core substrate 600 may include a core layer 602, a first metal layer 604 on a first surface of the core layer 602, and a second metal layer 606 on the second surface of the core layer 602.

Stage 2 illustrates a state after the core layer 602 after the first metal layer 604 and the second metal layer 606 have been removed. Different implementations may remove the first metal layer 604 and the second metal layer 606 differently. In some implementations, the first metal layer 604 and/or the second metal layer 606 are patterned by selectively removing portions of the first metal layer 604 and/or the second metal layer 606. Stage 2 also illustrates a state after a cavity 603 is formed in the core layer 602. In some implementations, a laser may be used to form the cavity 603. The core layer 602 may be similar to the core layer 206 described above.

Stage 3 illustrates a state after the core layer 602 is coupled to (e.g., placed on) a carrier 608. The carrier 608 may be a substrate, and adhesive and/or a carrier tape.

Stage 4 illustrates a state after a die 610 is coupled to (e.g., placed on) the carrier 608. The die 610 may be placed in the cavity 603 of the core layer 602. The die 610 may include a first pad 612.

Stage 5 illustrates a state after an encapsulation layer 620 is formed at least partially on the core layer 602 and the die 610. The encapsulation layer 620 may be similar to the encapsulation layer 208 described above.

Stage 6 illustrates a state after the carrier 608 is decoupled (e.g., detached, removed) from the core layer 602, the die 610, and the encapsulation layer 620.

Stage 7, as shown in FIG. 6B, illustrates a state after a dielectric layer 630 is formed on the core layer 602, the die 610, and the encapsulation layer 620. The dielectric layer 630 may be a photo imageable dielectric (PID) layer. The dielectric layer 630 is formed such that the dielectric layer 630 is coupled to a front side (e.g., active side) of the die 610.

Stage 8 illustrates a state after a cavity 631 is formed in the dielectric layer 630. The cavity 631 is formed such that the cavity 631 exposes the first pad 612. In some implementations, a lithography process is used to form the cavity 631.

Stage 9 illustrates a state after a first interconnect 632 (e.g., first via) and a second interconnect 634 (e.g., first pad) are formed in/on the dielectric layer 630. In some implementations, a plating process is used to form the first interconnect 632 and/or the second interconnect 634. The first interconnect 632 is formed such that the first interconnect 632 is coupled to the first pad 612. A plating process may be used to form the interconnects.

Stage 10 illustrates a state after a solder resist layer 640 is formed on the dielectric layer 630. Some portions of the interconnects (e.g., portion of the second interconnect 634) are not covered by the solder resist layer 640. In some implementations, the dielectric layer 630, the first interconnect 632, the second interconnect 634, and the solder resist layer 640 may form a redistribution portion of a package. In some implementations, the first pad 612 is part of the redistribution portion.

Stage 11 illustrates a state after a solder ball 650 is coupled to the second interconnect 634. Stage 11 illustrates a package 660 that includes the core layer 602, the die 610, the first pad 612, the encapsulation layer 620, the dielectric layer 630, the first interconnect 632, the second interconnect 634, and the solder resist layer 640. In some implementations, the package 660 is a reinforced fan-out wafer level package. The package 660 may be similar to the package 200 of FIG. 2.

Exemplary Sequence for Fabricating a Reinforced Fan-Out Wafer Level Package Comprising a Core Layer FIG. 7 (which includes FIGS. 7A-7C) illustrates an exemplary sequence for providing/fabricating another reinforced fan-out wafer level package that includes a core layer. In some implementations, the sequence of FIG. 7 may be used to provide/fabricate the packages of FIGS. 2-5 and/or other packages described in the present disclosure. However, for the purpose of simplification, FIG. 7 will be described in the context of providing/fabricating the package of FIG. 3.

It should be noted that the sequence of FIG. 7 may combine one or more stages in order to simplify and/or clarify the sequence for providing a package. In some implementations, the order of the processes may be changed or modified.

Figure 7A:
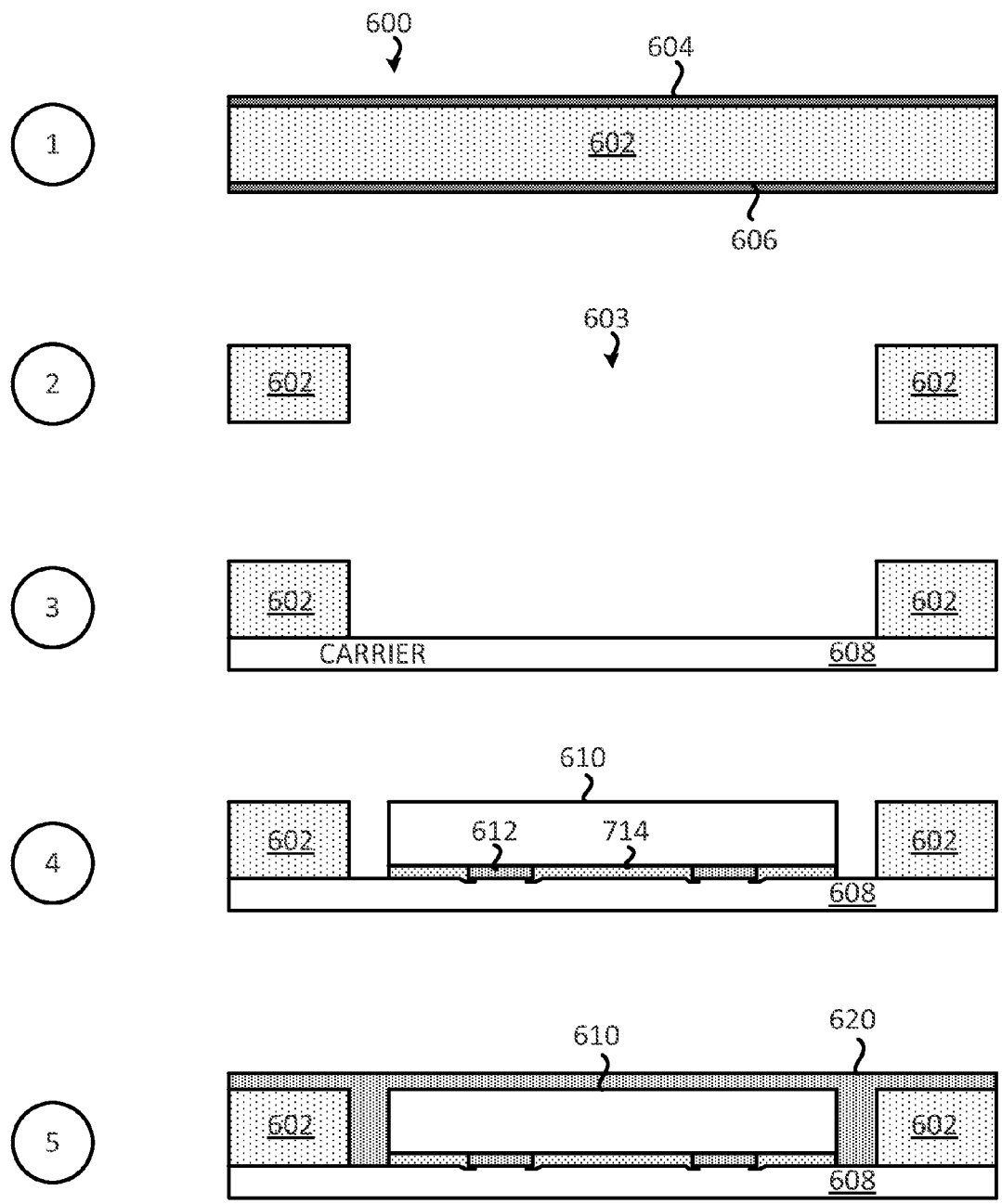
FIG. 7 (which comprises FIGS. 7A-7C) illustrates an example of a sequence for fabricating a package with a core layer.

Stage 1, as shown in FIG. 7A, illustrates a state after a core substrate 600 that is provided. The core substrate 600 may include a core layer 602, a first metal layer 604 on a first surface of the core layer 602, and a second metal layer 606 on the second surface of the core layer 602.

Stage 2 illustrates a state after the core layer 602 after the first metal layer 604 and the second metal layer 606 have been removed. Different implementations may remove the first metal layer 604 and the second metal layer 606 differently. In some implementations, the first metal layer 604 and/or the second metal layer 606 are patterned by selectively removing portions of the first metal layer 604 and/or the second metal layer 606. Stage 2 also illustrates a state after a cavity 603 is formed in the core layer 602. In some implementations, a laser may be used to form the cavity 603. The core layer 602 may be similar to the core layer 206 described above.

Stage 3 illustrates a state after the core layer 602 is coupled to (e.g., placed on) a carrier 608. The core layer 602 may be a substrate, an adhesive, and/or a carrier tape.

Stage 4 illustrates a state after a die 610 is coupled to (e.g., placed on) the carrier 608. The die 610 may be placed in the cavity 603 of the core layer 602. The die 610 may include a first pad 612 and a passivation layer 714.

Stage 5 illustrates a state after an encapsulation layer 620 is formed at least partially on the core layer 602 and the die 610. In some implementations, the encapsulation layer 620 is formed to completely encapsulate the core layer 602 and/or the die 610. The encapsulation layer 620 may be similar to the encapsulation layer 208 described above.

Figure 7B:
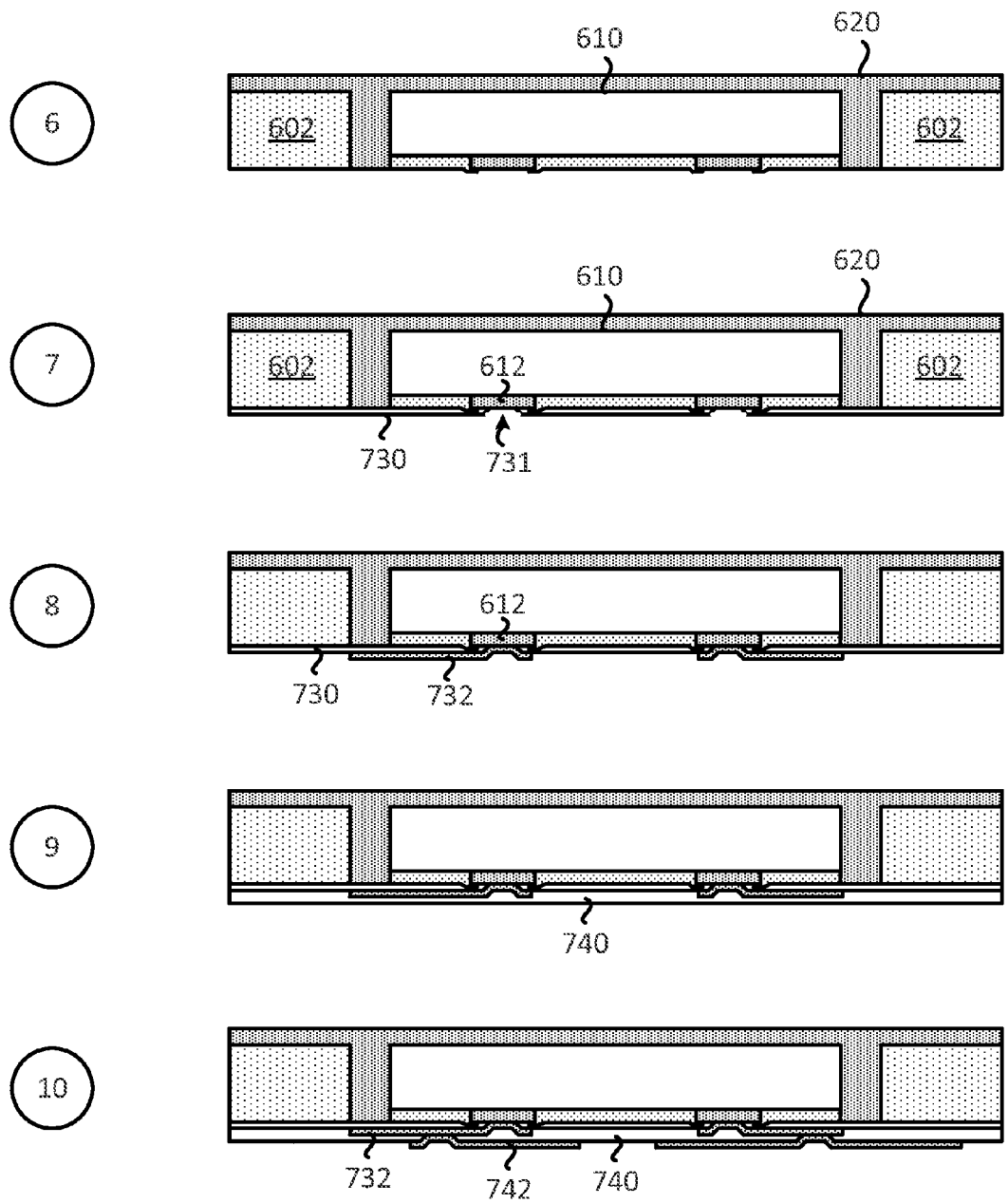

Stage 6, as shown in FIG. 7B, illustrates a state after the carrier 608 is decoupled (e.g., detached, removed) from the core layer 602, the die 610, and the encapsulation layer 620.

Stage 7 illustrates a state after a first dielectric layer 630 is formed on the core layer 602, the die 610, and the encapsulation layer 620. The dielectric layer 730 may be a first photo imageable dielectric (PID) layer. The first dielectric layer 730 is formed such that the first dielectric layer 730 is coupled to a front side (e.g., active side) of the die 610. The first dielectric layer 730 may be formed on the passivation layer 714. Stage 7 also illustrates a cavity 731 that is formed in the first dielectric layer 730. The cavity 731 is formed such that the cavity 731 exposes the first pad 612. In some implementations, a lithography process is used to form the cavity 731.

Stage 8 illustrates a state after a first interconnect 732 (e.g., first redistribution interconnect) is formed on the first dielectric layer 730. The first interconnect 732 may be part of a first redistribution layer. A plating process may be used to form the interconnects.

Stage 9 illustrates a state after a second dielectric layer 740 is formed on the first dielectric layer 730 and/or the first interconnect 732. The second dielectric layer 740 may be a second photo imageable dielectric (PID) layer or a prepeg layer.

Stage 10 illustrates a state after a second interconnect 742 (e.g., second redistribution interconnect) is formed on the second dielectric layer 740. The second interconnect 742 is formed such that the second interconnect 742 is coupled to the first interconnect 732. The second interconnect 742 may be part of a second redistribution layer. A plating process may be used to form the interconnects.

Figure 7C:
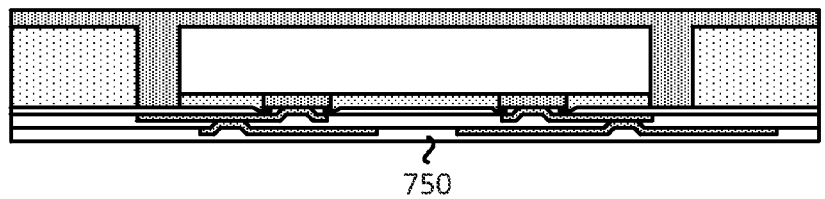
Figure 7C:
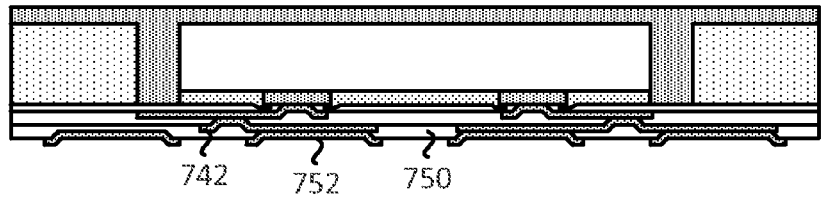
Figure 7C:
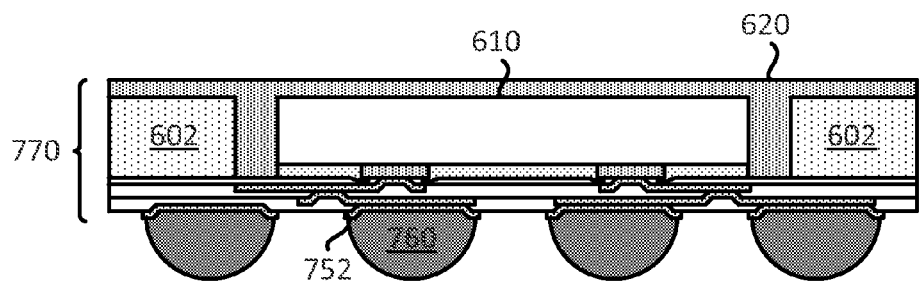

Stage 11, as shown in FIG. 7C, illustrates a state after a third dielectric layer 750 is formed on the second dielectric layer 740 and/or the second interconnect 742. The third dielectric layer 750 may be a third photo imageable dielectric (PID) layer or a prepeg layer.

Stage 12 illustrates a state after a third interconnect 752 (e.g., under bump metallization (UBM) interconnect) is formed on the third dielectric layer 750. The third interconnect 752 is formed such that the third interconnect 752 is coupled to the second interconnect 742. A plating process may be used to form the interconnects. In some implementations, the first dielectric layer 730, the first interconnect 732, the second dielectric layer 740, the second interconnect 742, the third dielectric layer 750, and the third interconnect 752 may form a redistribution portion of a package.

Stage 13 illustrates a state after a solder ball 760 is coupled to the third interconnect 752. Stage 13 illustrates a package 770 that includes the core layer 602, the die 610, the encapsulation layer 620, the first dielectric layer 730, the first interconnect 732, the second dielectric layer 740, the second interconnect 742, the third dielectric layer 750, and the third interconnect 752. In some implementations, the package 770 is a reinforced wafer level package. The package 770 may be similar to the package 300 of FIG. 3.

Figure 8:
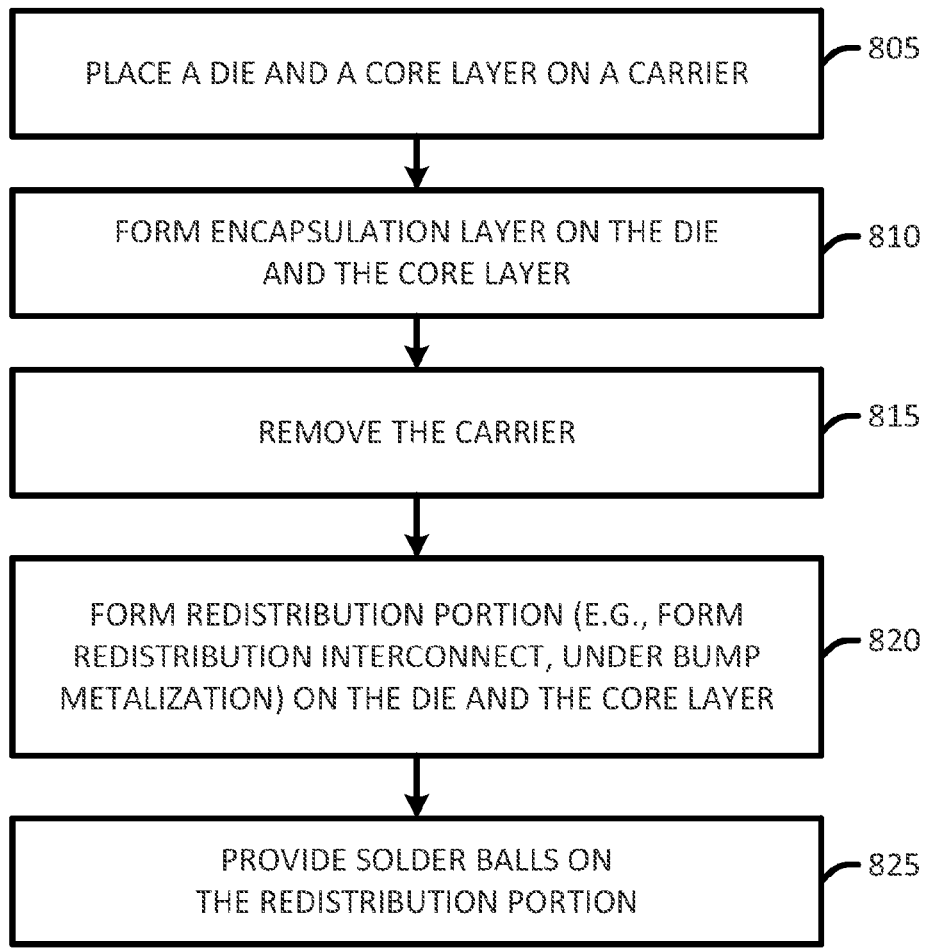
FIG. 8 illustrates an example of a flow diagram of a method for fabricating a package with a core layer.

Exemplary Method for Fabricating a Reinforced Fan-Out Wafer Level Package Comprising a Core Layer FIG. 8 illustrates an exemplary flow diagram of a method for providing/fabricating a reinforced wafer level a package that includes a core layer. In some implementations, the method of FIG. 8 may be used to provide/fabricate the package of FIGS. 2-5 and/or other packages described in the present disclosure.

It should be noted that the flow diagram of FIG. 8 may combine one or more step and/or processes in order to simplify and/or clarify the method for providing a package. In some implementations, the order of the processes may be changed or modified. FIG. 8 is described with respect with one die and/or one package being fabricated. However, in some implementations, several dies and/or packages may be fabricated at the same time. In such instances, a singulation process may be used to create individual dies and/or packages.

The method places (at 805) a die and a core layer on a carrier. The die may be identical and/or similar to the first die 202. The die may be a logic die and/or a memory die. The die may include a substrate portion (e.g., silicon substrate), a pad, and a first passivation layer. The core layer may be identical and/or similar to the core layer 206. A first metal layer and a second metal layer may be coupled to the core layer. In some implementations, more than one die may be placed on the carrier. In some implementations, the die and another electronic component (e.g., capacitor) may be placed on the carrier.

The method forms (at 810) an encapsulation layer on the die and the core layer. The encapsulation layer is formed such that the encapsulation layer encapsulates the die and the core layer.

The method then decouples (at 815) (e.g., removes) the carrier from the die, the core layer, and the encapsulation layer.

The method forms (at 820) a redistribution portion on the die and the core layer. In some implementations, forming the redistribution portion includes forming a first dielectric layer, a first redistribution layer (e.g., first redistribution interconnect), a second dielectric layer and a second redistribution layer (e.g., second redistribution interconnect), a third dielectric layer and/or an under bump metallization (UBM) layer. One or more of the dielectric layers may be a photo imageable dielectric (PID) layer.

The method couples (at 825) a solder ball to the redistribution portion (e.g., coupling a solder ball to a UBM layer). The solder ball may be coupled to a pad, a UBM layer or a redistribution layer.

Exemplary Reinforced Fan-Out Wafer Level Package Comprising a Core Layer

Figure 9:
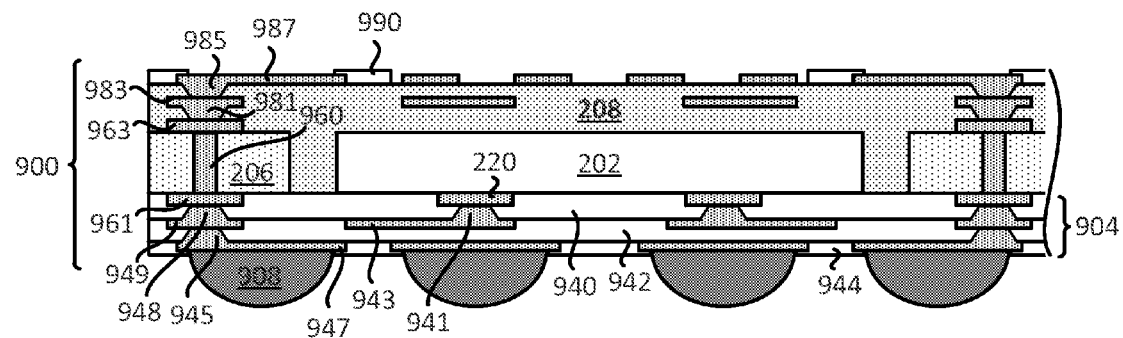
FIG. 9 illustrates an example of a close up view of a package with a core layer comprising a via.

FIG. 9 illustrates another package 900 that includes a core layer for reducing the stress on solder joints in the package 900. The package 900 may be a package in a package on package (PoP) device. Examples of package on package (PoP) devices are further illustrated and described below in FIGS. 17-18.

The package 900 may be a reinforced wafer level package. The package 900 includes the first die 202, a redistribution portion 904, the core layer 206, and the encapsulation layer 208. A die (e.g., first die 202) may be an integrated circuit (IC) that includes several transistors and/or other electronic components. The first die 202 may be a logic die and/or a memory die. The first die 202 may be a bare die. The first die 202 may also include the first pad 220.

The first die 202 is coupled to the redistribution portion 904. The core layer 206 is coupled to the redistribution portion 904. The encapsulation layer 208 encapsulates at least part of the first die 202, and at least part of the core layer 206. In some implementations, the core layer 206 is used to reinforce the package 900. In some implementations, the core layer 206 is configured to help reduce the stress on solder joints in the package 900, which in turn, increases the life expectancy and reliability of the solder joints (e.g., solder ball 250) of the package 900.

The first die 202 has a front side (e.g., active side) and a back side. The front side of the first die 202 may include the first pad 220. FIG. 9 illustrates that the front side of the first die 202 is coupled to the redistribution portion 904. The back side of the first die 202 is encapsulated by the encapsulation layer 208.

The core layer 206 is located laterally to the first die 202 in the package 900. In some implementations, the core layer 206 may laterally surround the first die 202. The core layer 206 includes a via 960 that traverses the core layer 206. A first pad 961 is on a first surface of the core layer 206. A second pad 963 is on a second surface of the core layer 206. The first pad 961 is coupled to the via 960. The via 960 is coupled to the second pad 963. The first pad 961 is coupled to the redistribution portion 904. In some implementations, the first pad 961 is an interconnect that is part of the redistribution portion 904.

The encapsulation layer 208 includes a first interconnect 981 (e.g., first via), a second interconnect 983 (e.g., first pad), a third interconnect 985 (e.g., second via), and a fourth interconnect 987 (e.g., second pad). The first interconnect 981, the second interconnect 983, the third interconnect 985, and the fourth interconnect 987 may be encapsulation interconnects. The second pad 963 is coupled to the first interconnect 981. The first interconnect 981 is coupled to the second interconnect 983. The second interconnect 983 is coupled to the third interconnect 985. The third interconnect 985 is coupled to the fourth interconnect 987. A solder resist layer 990 is formed on the encapsulation layer 208.

Different materials may be used for the core layer 206 and/or the encapsulation layer 208. Exemplary properties for these materials were previously described above.

The redistribution portion 904 includes a first dielectric layer 940, a second dielectric layer 942, a third dielectric layer 944 (e.g., solder resist layer), a first interconnect 941 (e.g., first via), a second interconnect 943 (e.g., first pad, first trace), a third interconnect 945 (e.g., second via), a fourth interconnect 947 (e.g., second pad), a fifth interconnect 948 (e.g., third via), and a sixth interconnect 949 (e.g., third pad). The redistribution portion 904 may also include the first pad 961 and/or the first pad 220. The fifth interconnect 948 is coupled to the first pad 961. A solder ball 908 is coupled to the redistribution portion 904. More specifically, the solder ball 908 is coupled to the fourth interconnect 947 of the redistribution portion 904.

In some implementations, one or more of the dielectric layers (e.g., first dielectric layer 940) may be a photo-imageable dielectric (PID) layer. In some implementations, one or more of the dielectric layers may be a prepeg layer. For example, in some implementations, the first dielectric layer 940 may be a first photo-imageable dielectric (PID) layer and the second dielectric layer 942 may be a prepeg layer (e.g., prepeg dielectric layer). In some implementations, the first dielectric layer 940 may be a first photo-imageable dielectric (PID) layer, and the second dielectric layer 942 may be the same or similar material as the encapsulation layer 208.

In some implementations, the interconnects in the redistribution portion 904 may have a pitch of about 30 microns ($\mu$m) or less (e.g., L/S 15/15 microns or less, where L is line width and S is spacing). In some implementations, the use of a photo-imageable dielectric (PID) layer allows for interconnects (e.g., vias) with substantially lower diameters. In some implementations, vias in a photo-imageable dielectric (PID) layer may have a diameter of about 30 microns ($\mu$m) or less. For example, the first interconnect 941 (e.g., first via) and/or the fifth interconnect 948 (e.g., third via), which are formed in the first dielectric layer 940, may have a diameter of about 30 microns ($\mu$m) or less. In some implementations, vias in a non-photo-imageable dielectric (PID) layer (e.g., prepeg layer, encapsulation layer, core layer), may have a diameter of about 40 microns ($\mu$m) or greater.

Figure 10:
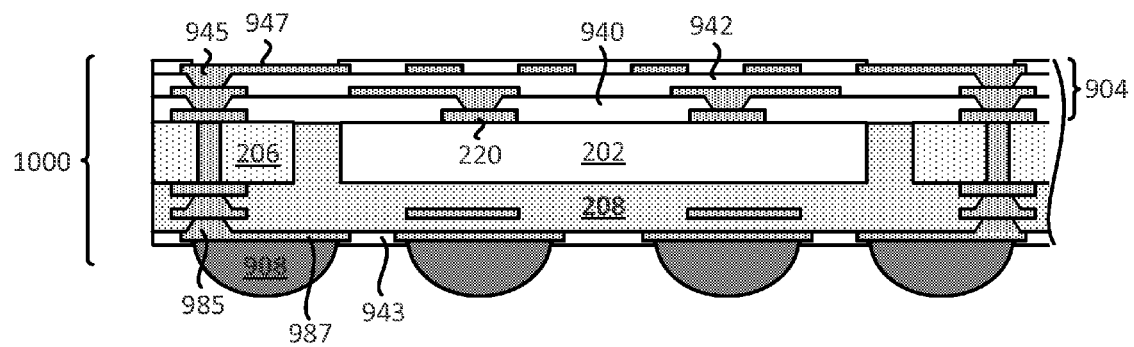
FIG. 10 illustrates an example of a close up view of a package with a core layer comprising a via.

FIG. 10 illustrates an example of another package 1000 that includes a core layer. The package 1000 may be a package in package on package (PoP) device. The package 1000 is similar to the package 900, except that the die 202 in the package 1000 is positioned in the package 1000 differently.

FIG. 9 illustrates that the front side of the first die 202 is facing the printed circuit board (PCB) side of the package 900. That is, when the package 900 is coupled to a PCB, the front side of the first die 202 is facing the PCB. The front side of the first die 202 is facing the solder ball 908, which is a solder ball that is going to be coupled to a PCB.

FIG. 10 illustrates that the front side of the first die 202 is facing away from the printed circuit board (PCB) side of the package 1000. That is, when the package 1000 is coupled to a PCB, the front side of the first die 202 is facing away from the PCB. The front side of the first die 202 is facing away from the solder ball 908, which is a solder ball that is going to be coupled to a PCB. In other words, when the package 1000 is coupled to a PCB board, the back side of the first die 202 is facing the PCB (e.g., back side of the first die 202 is facing the solder ball 908).

Exemplary Reinforced Fan-Out Wafer Level Package Comprising a Core Layer

Figure 11:
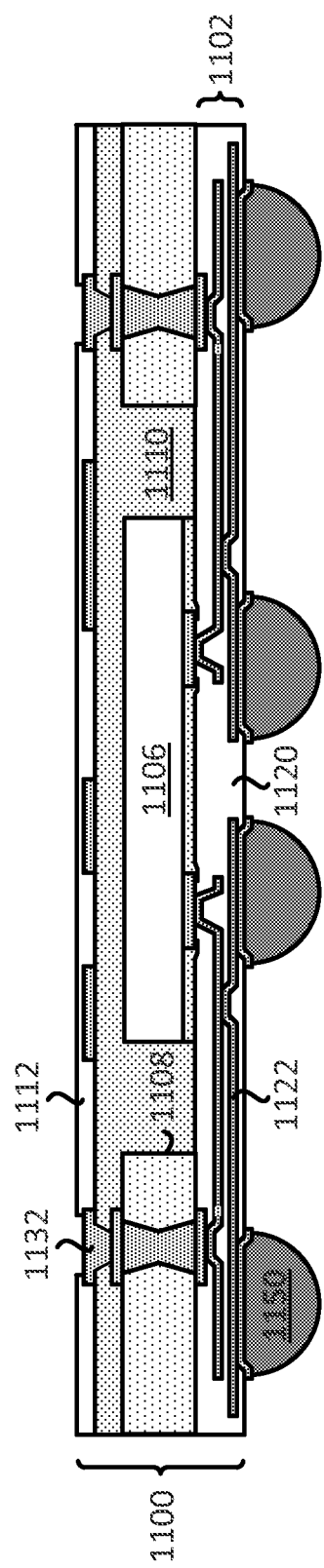
FIG. 11 illustrates an example of a package with a core layer comprising a via.

FIG. 11 illustrates another package 1100 that includes a core layer for reducing the stress on solder joints in the package 100. The package 1100 may be a package in a package on package (PoP) device.

The package 1100 includes a redistribution portion 1102, a first die 1106, a core layer 1108, an encapsulation layer 1110, and a solder resist layer 1112. The redistribution portion 1102 includes at least one dielectric layer 1120 and several interconnects 1122 (e.g., redistribution interconnects, under bump metallization (UBM) interconnects). In some implementations, the core layer 1108 is used to reinforce the package 1100. In some implementations, the core layer 1108 is configured to help reduce the stress on solder joints in the package 1100, which in turn, increases the life expectancy and reliability of the solder joints (e.g., solder ball 1150) of the package 1100.

In some implementations, the interconnects in the redistribution portion 1102 may have a pitch of about 30 microns ($\mu$m) or less (e.g., L/S 15/15 microns or less, where L is line width and S is spacing). In some implementations, the use of a photo-imageable dielectric (PID) layer allows for interconnects (e.g., vias) with substantially lower diameters. In some implementations, vias in a photo-imageable dielectric (PID) layer may have a diameter of about 30 microns ($\mu$m) or less. In some implementations, vias in a non-photo-imageable dielectric (PID) layer (e.g., prepeg layer, encapsulation layer, core layer), may have a diameter of about 40 microns ($\mu$m) or greater.

The core layer 1108 includes a via. A first metal layer and a second metal layer may be coupled to the core layer 1108. The encapsulation layer 1110 may include several interconnects 1132 (e.g., encapsulation interconnects, encapsulation via, encapsulation trace, encapsulation pad).

The package 1100 may be a reinforced fan-out wafer level package. The first die 1106 is coupled to the redistribution portion 1102. The core layer 1108 is coupled to the redistribution portion 1102. The encapsulation layer 1110 encapsulates at least part of the first die 1106, and at least part of the core layer 1108. In some implementations, the core layer 1108 is used to reinforce the package 1100.

Figure 12:
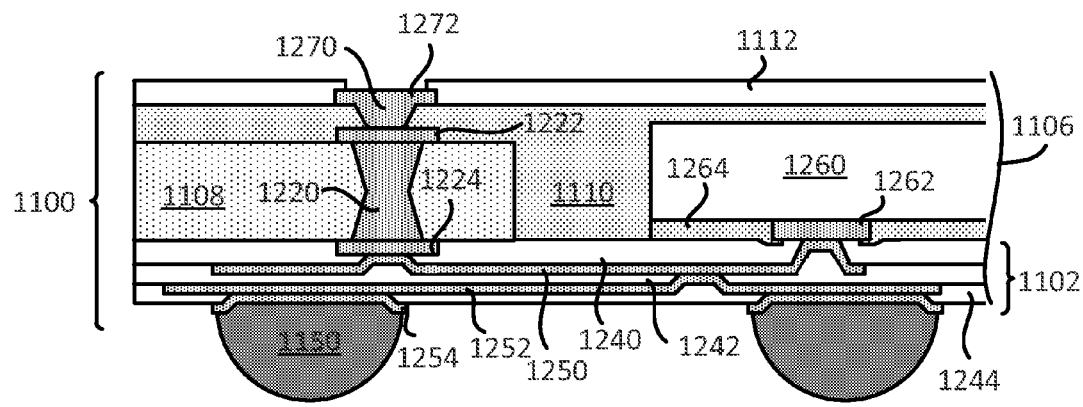
FIG. 12 illustrates an example of a close up view of a package with a core layer comprising a via.

FIG. 11 illustrates a high level illustration of a package that includes a core layer. FIG. 12 illustrates a close up view of the package 1100 of FIG. 11.

As shown in FIG. 12, the package 1100 includes the redistribution portion 1102, the first die 1106, the core layer 1108, the encapsulation layer 1110, the solder resist layer 1112, and the solder ball 1150. The first die 1106 is coupled to the redistribution portion 1102. The core layer 1108 is coupled to the redistribution portion 1102. The encapsulation layer 1110 encapsulates the first die 1106 and the core layer 1108. The encapsulation layer 1110 includes a first interconnect 1270 (e.g., first via, first encapsulation interconnect, first encapsulation via) and a second interconnect 1272 (e.g., first pad, second encapsulation interconnect, first encapsulation pad).

The core layer 1108 includes a first via 1220. A first pad 1222 and a second pad 1224 are coupled to the core layer 1108. The first pad 1222 is coupled to the first via 1220. The via 1220 is coupled to the second pad 1224.

As shown in FIG. 12, the redistribution portion 1102 includes a first dielectric layer 1240, a second dielectric layer 1242, a third dielectric layer 1244, a first redistribution layer 1250, a second redistribution layer 1252, an under bump metallization (UBM) layer 1254, and the solder ball 1150. The first dielectric layer 1240, the second dielectric layer 1242, and/or the third dielectric layer 1244 may be represented as the at least one dielectric layer 1120 as shown in FIG. 11. The first redistribution layer 1250 is coupled to the core layer 1108 and the first die 1106. More specifically, the first redistribution layer 1250 is coupled to the second pad 1224 of the core layer 1108. In some implementations, the first redistribution layer 1250 may define one or more first redistribution interconnects in the redistribution portion 1102. The second redistribution layer 1252 is coupled to the first redistribution layer 1250. The UBM layer 1254 is coupled to the second redistribution layer 1252. The solder ball 1150 is coupled to the UBM layer 1254. In some implementations, the UBM layer 1254 may be optional. In such instances, the solder ball 1150 may be directly coupled to the second redistribution layer 1252. It is noted that different implementations may have a different number of redistribution layers (e.g., one or more redistribution layers).

In some implementations, the interconnects in the redistribution portion 1102 may have a pitch of about 30 microns (μm) or less (e.g., L/S 15/15 microns or less, where L is line width and S is spacing). In some implementations, the use of a photo-imageable dielectric (PID) layer allows for interconnects (e.g., vias) with substantially lower diameters. In some implementations, vias in a photo-imageable dielectric (PID) layer may have a diameter of about 30 microns (μm) or less. In some implementations, vias in a non-photo-imageable dielectric (PID) layer (e.g., prepeg layer, encapsulation layer, core layer), may have a diameter of about 40 microns (μm) or greater.

The first die 1106 may include a substrate portion 1260 (e.g., silicon substrate), a pad 1262, and a first passivation layer 1264. In some implementations, the pad 1262 of the first die 1106 is coupled to the first redistribution layer 1250 of the redistribution portion 1102.

Figure 13:
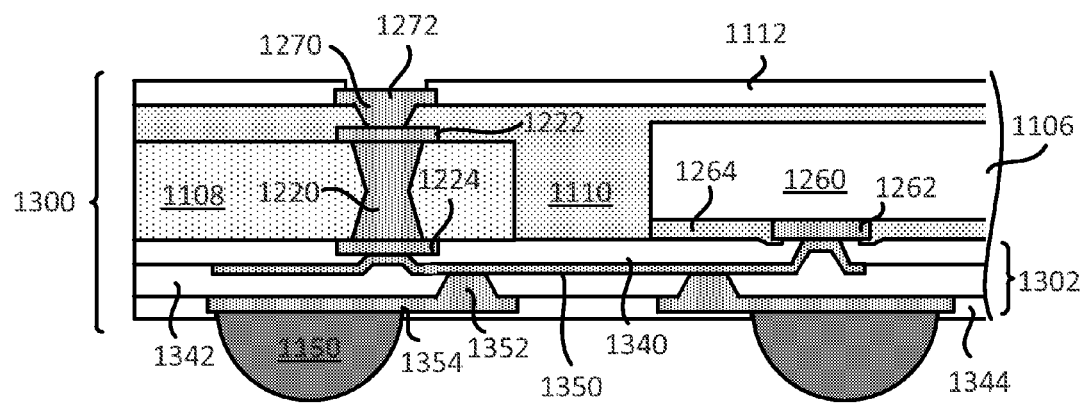
FIG. 13 illustrates an example of a close up view of a package with a core layer comprising a via.

FIG. 13 illustrates a close up view of another package 1300. The package 1300 is similar to the package 1100 of FIG. 12, except that package 1300 has a different redistribution portion 1302. The package 1300 may be a reinforced fan-out wafer level package that is implemented in a package on package (PoP) device. As shown in FIG. 13, the package 1300 includes a redistribution portion 1302, the first die 1106, the core layer 1108, the encapsulation layer 1110, the solder resist layer 1112, and the solder ball 1150. The first die 1106 is coupled to the redistribution portion 1302. The core layer 1108 is coupled to the redistribution portion 1102. The encapsulation layer 1110 encapsulates the first die 1106 and the core layer 1108.

As further shown in FIG. 13, the redistribution portion 1302 includes a first dielectric layer 1340, a second dielectric layer 1342, a third dielectric layer 1344, a first redistribution layer 1350, a first interconnect 1352 (e.g., first via) a second interconnect 1354 (e.g., first pad), and the solder ball 1150. The first redistribution layer 1350 is coupled to the core layer 1108 and the first die 1106. More specifically, the first redistribution layer 1350 is coupled to the second pad 1224 of the core layer 1108. In some implementations, the first redistribution layer 1350 may define one or more first redistribution interconnects in the redistribution portion 1302. The first interconnect 1352 is coupled to the first redistribution layer 1350. The second interconnect 1354 is coupled to the first interconnect 1352. The solder ball 1150 is coupled to the second interconnect 1354. It is noted that different implementations may have a different number of redistribution layers (e.g., one or more redistribution layers). In some implementations, how the interconnects and redistribution layers are coupled may be different. For example, the first interconnect 1352 may be coupled to the second pad 1224, the second interconnect 1354 may be coupled to the first interconnect, and the first redistribution layer 1350 may be coupled to the second interconnect 1354.

In some implementations, the interconnects in the redistribution portion 1302 may have a pitch of about 30 microns (μm) or less (e.g., L/S 15/15 microns or less, where L is line width and S is spacing). In some implementations, the use of a photo-imageable dielectric (PID) layer allows for interconnects (e.g., vias) with substantially lower diameters. In some implementations, vias in a photo-imageable dielectric (PID) layer may have a diameter of about 30 microns (μm) or less. In some implementations, vias in a non-photo-imageable dielectric (PID) layer (e.g., prepeg layer, encapsulation layer, core layer), may have a diameter of about 40 microns (μm) or greater.

Figure 14A:
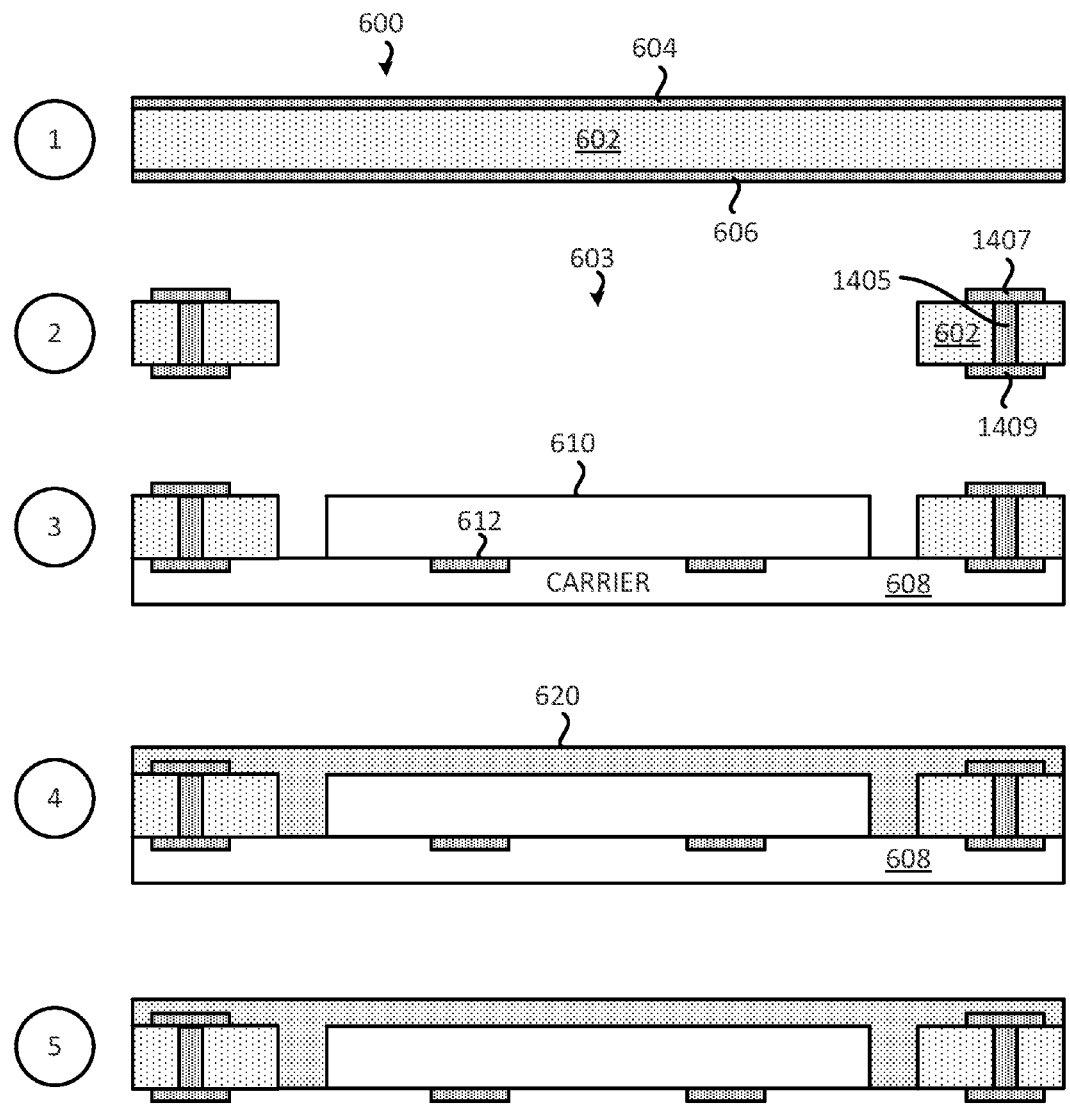
FIG. 14 (which comprises FIGS. 14A-14C) illustrates an example of a sequence for fabricating a package with a core layer comprising a via.
Figure 14B:
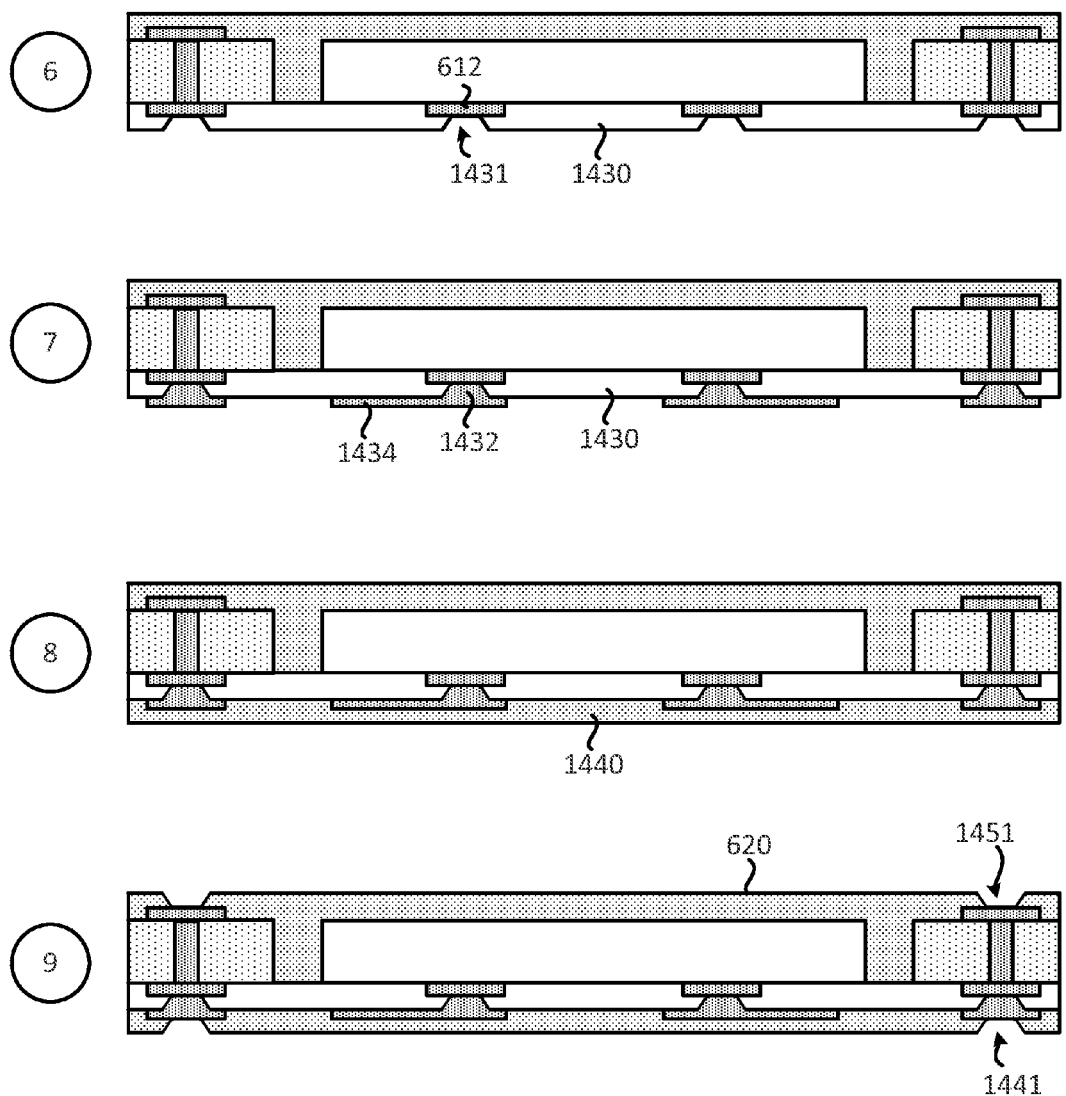
Figure 14C:
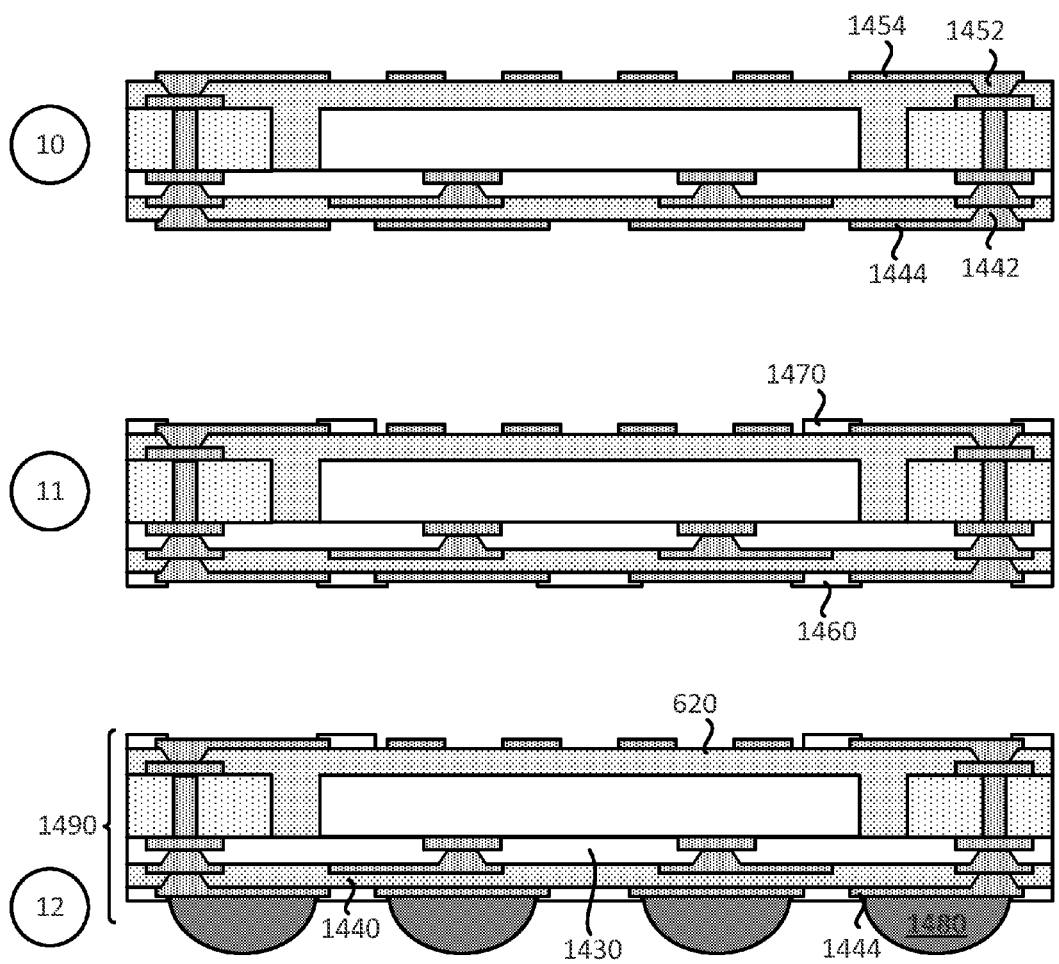

Exemplary Sequence for Fabricating a Reinforced Fan-Out Wafer Level Package Comprising a Core Layer FIG. 14 (which includes FIGS. 14A-14C) illustrates an exemplary sequence for providing/fabricating another reinforced wafer level a package that includes a core layer. In some implementations, the sequence of FIG. 14 may be used to provide/fabricate the packages of FIGS. 9-13 and/or other packages described in the present disclosure. However, for the purpose of simplification, FIG. 14 will be described in the context of providing/fabricating a package similar to the package of FIG. 9.

It should be noted that the sequence of FIG. 14 may combine one or more stages in order to simplify and/or clarify the sequence for providing a package. In some implementations, the order of the processes may be changed or modified.

Stage 1, as shown in FIG. 14A, illustrates a state after a core substrate 600 that is provided. The core substrate 600 may include a core layer 602, a first metal layer 604 on a first surface of the core layer 602, and a second metal layer 606 on the second surface of the core layer 602.

Stage 2 illustrates a state after the core substrate 600 has been patterned. As shown at stage 2, the core layer 602 includes a via 1405, a first pad 1407, and a second pad 1409. The first pad 1407 is on a first surface of the core layer 602. The second pad 1409 is on a second surface of the core layer 602. Stage 2 also illustrates a state after a cavity 603 is formed in the core layer 602. In some implementations, a laser may be used to form the cavity 603.

Stage 3 illustrates a state after the core layer 602 and a die 610 are coupled to (e.g., placed on) a carrier 608. The die 610 may include a first pad 612 (e.g., the first pad 612 is part of the die 610). The carrier 608 may be a substrate, an adhesive and/or a carrier tape.

Stage 4 illustrates a state after an encapsulation layer 620 is formed at least partially on the core layer 602 and the die 610. The encapsulation layer 620 may be similar to the encapsulation layer 208 described above.

Stage 5 illustrates a state after the carrier 608 is decoupled (e.g., detached, removed) from the core layer 602, the die 610, and the encapsulation layer 620.

Stage 6, as shown in FIG. 14B, illustrates a state after a first dielectric layer 1430 is formed on the core layer 602, the die 610, and the encapsulation layer 620. The first dielectric layer 1430 may be a photo imageable dielectric (PID) layer. The first dielectric layer 1430 is formed such that the first dielectric layer 1430 is coupled to a front side (e.g., active side) of the die 610. The first dielectric layer 1430 may be formed on a passivation layer of the die 610. Stage 14 also illustrates a cavity 1431 that is formed in the first dielectric layer 1430. The cavity 1431 is formed such that the cavity 1431 exposes the first pad 612. In some implementations, a lithography process is used to form the cavity 1431.

Stage 7 illustrates a state after a first interconnect 1432 (e.g., first redistribution interconnect, first via) and a second interconnect 1434 (e.g., second redistribution interconnect, second trace) are formed in/on the first dielectric layer 1430. The first interconnect 1432 is coupled to the first pad 612. The second interconnect 1432 is coupled to the first interconnect 1432. The first interconnect 1432 and the second interconnect 1434 may be part of the same first redistribution layer. A plating process may be used to form the interconnects.

Stage 8 illustrates a state after a second dielectric layer 1440 is formed on the first dielectric layer 1430, the first interconnect 1432 and the second interconnect 1434. The second dielectric layer 1440 may be a PID layer or a prepeg layer. In some implementations, the second dielectric layer 1440 may be the same material as the encapsulation layer 620.

Stage 9 illustrates a state after a first cavity 1441 is formed in the second dielectric layer 1440. Stage 9 also illustrates a state after second cavity 1451 is formed in the encapsulation layer 620. In some implementations, a laser process may be used to form the cavities. In some implementations, a lithography process may be used to form the cavities.

Stage 10, as shown in FIG. 14C, illustrates a state after a third interconnect 1442 (e.g., redistribution interconnect, third via) and a fourth interconnect 1444 (e.g., redistribution interconnect, fourth pad) are formed in/on the second dielectric layer 1440. The third interconnect 1442 and the fourth interconnect 1444 may be part of the same second redistribution layer. A plating process may be used to form the interconnects.

Stage 10 also illustrates a state after a fifth interconnect 1452 (e.g., encapsulation interconnect, fifth via) and a sixth interconnect 1454 (e.g., encapsulation interconnect, sixth pad) are formed in/on the encapsulation layer 620. The fifth interconnect 1452 and the sixth interconnect 1454 may be part of the same encapsulation layer. A plating process may be used to form the interconnects.

Stage 11 illustrates a state after a first solder resist layer 1460 is formed on the second dielectric layer 1440 and, a second solder resist layer 1470 is formed on the encapsulation layer 620.

Stage 12 illustrates a state after a solder ball 1480 is coupled to the fourth interconnect 1444. Stage 12 illustrates a package 1490 that includes the core layer 602, the die 610, the encapsulation layer 620, the first dielectric layer 1430, the first interconnect 1432, the second interconnect 1434, the second dielectric layer 1440, the third interconnect 1442, the fourth interconnect 1444, the fifth interconnect 1452, and the sixth interconnect 1454. In some implementations, the first dielectric layer 430 is a first photo imageable dielectric (PID) layer, and the second dielectric layer 1440 is a made of material that is the same or similar as the encapsulation layer 620. However, different implementations may use different materials for the encapsulation layer 620, the first dielectric layer 1430, and/or the second dielectric layer 1440.

In some implementations, the package 1490 is a reinforced wafer level package that is implemented in a package on package (PoP) device. Examples of package on package (PoP) devices are described below in FIGS. 17-18.

Exemplary Sequence for Fabricating a Reinforced Fan-Out Wafer Level Package Comprising a Core Layer FIG. 15 (which includes FIGS. 15A-15B) illustrates an exemplary sequence for providing/fabricating another reinforced wafer level a package that includes a core layer. In some implementations, the sequence of FIG. 15 may be used to provide/fabricate the packages of FIGS. 9-13 and/or other packages described in the present disclosure. However, for the purpose of simplification, FIG. 15 will be described in the context of providing/fabricating a package similar to the package of FIG. 12.

It should be noted that the sequence of FIG. 15 may combine one or more stages in order to simplify and/or clarify the sequence for providing a package. In some implementations, the order of the processes may be changed or modified.

Figure 15A:
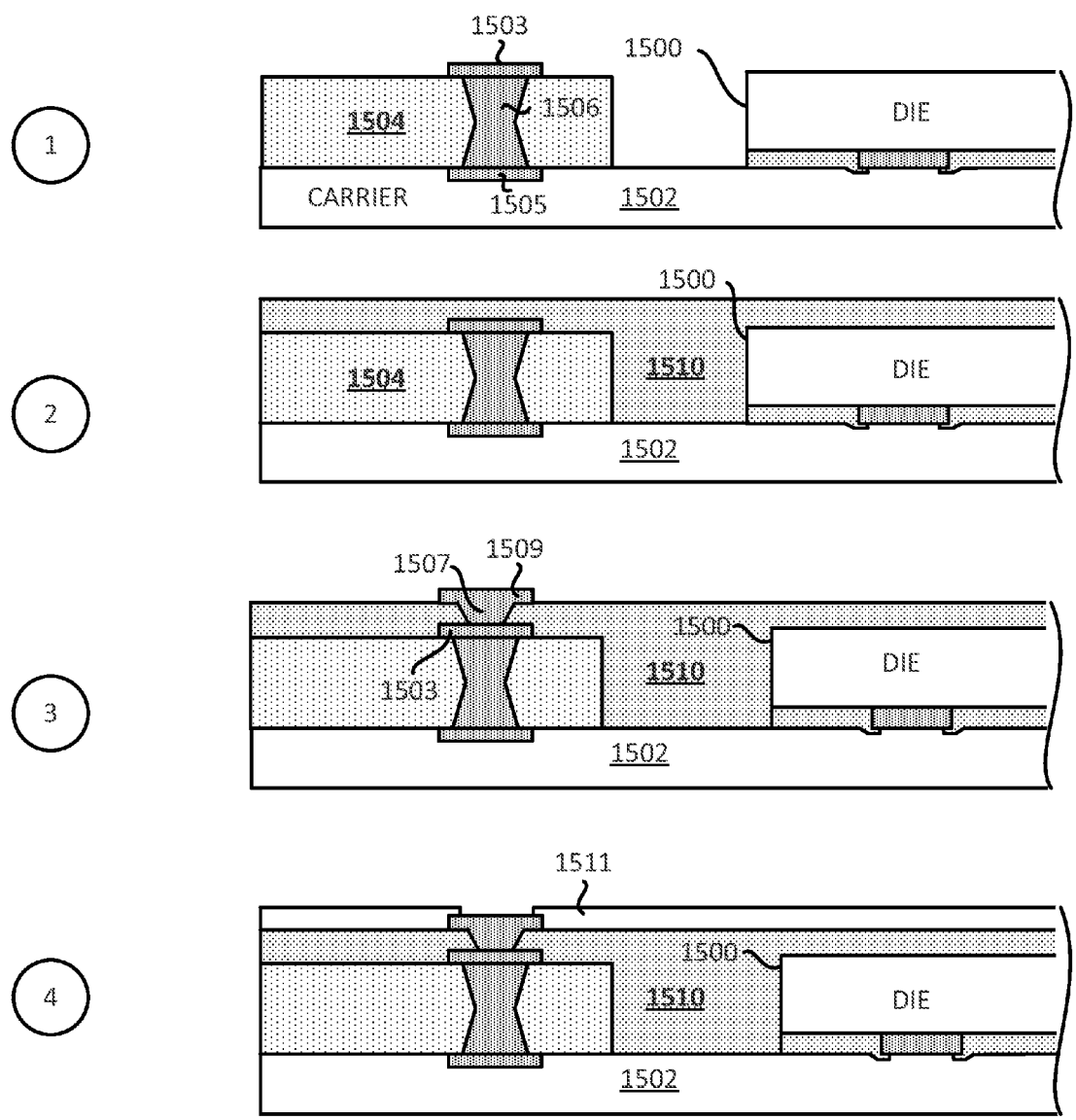
FIG. 15 (which comprises FIGS. 15A-15C) illustrates an example of a sequence for fabricating a package with a core layer comprising a via.

Stage 1, as shown in FIG. 15A, illustrates a state after a die 1500 and a core layer 1504 are coupled (e.g., placed) to a carrier 1502. The die 1500 may include a substrate portion (e.g., silicon substrate), a pad, and a first passivation layer. The core layer 1504 may include a via 1506, a first pad 1503, and a second pad 1505. The carrier 1502 may be a substrate, an adhesive and/or a carrier tape.

Stage 2 illustrates a state after an encapsulation layer 1510 is formed at least partially on the core layer 1504 and the die 1500. The encapsulation layer 1510 may be similar to the encapsulation layer 208 described above.

Stage 3 illustrates a state after a first interconnect 1507 (e.g., first encapsulation interconnect, via) and a second interconnect 1509 (e.g., second encapsulation interconnect, pad) are formed in the encapsulation layer 1510. In some implementations, a plating process is used to form the interconnects in/on the encapsulation layer 1510.

Stage 4 illustrates a state after a solder resist layer 1511 is formed on the encapsulation layer 1510.

Figure 15B:
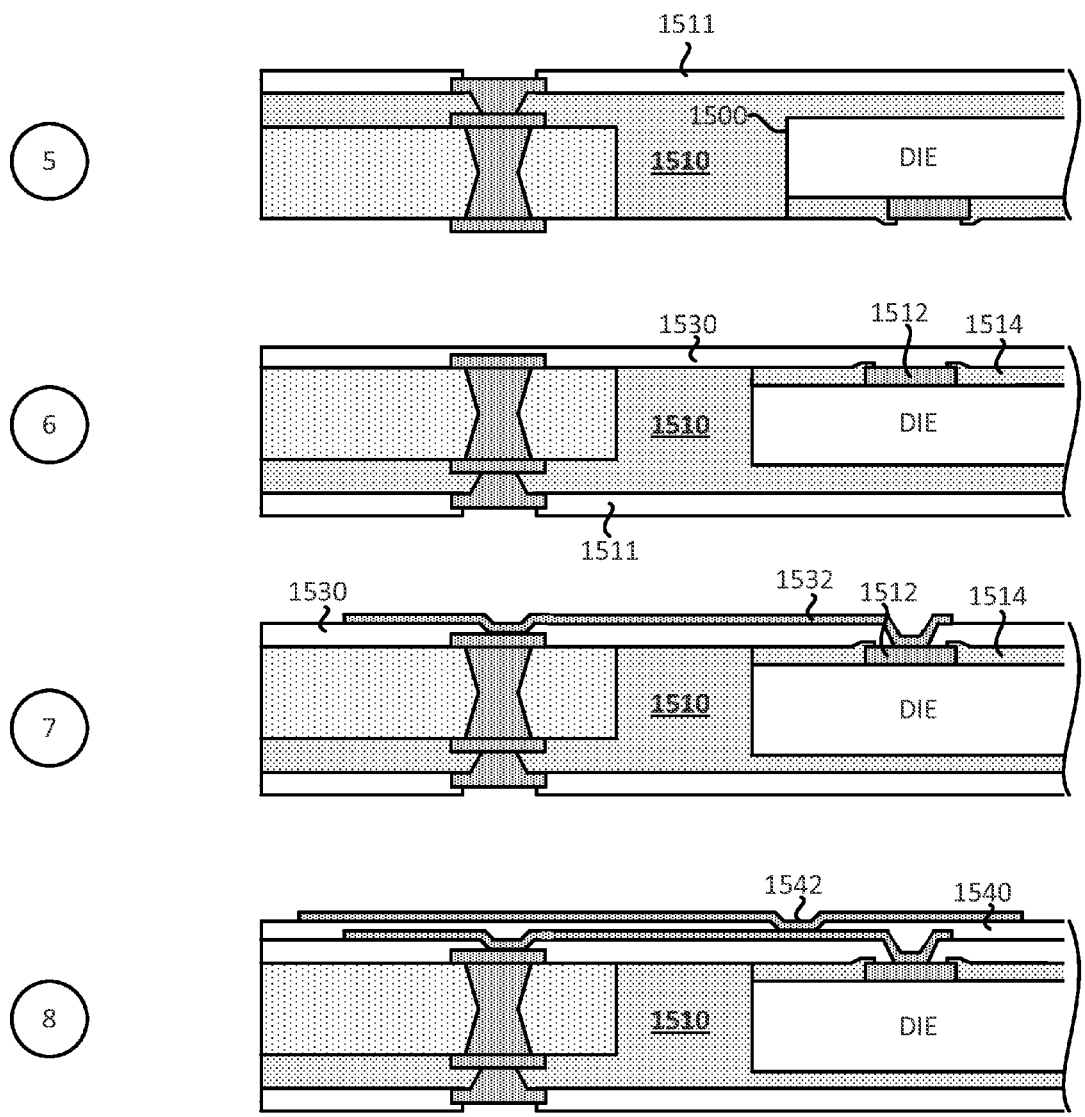

Stage 5, as shown in FIG. 15B, illustrates a state after the carrier 1502 is decoupled (e.g., detached, removed) from the core layer 1504, the die 1500, and the encapsulation layer 1510.

Stage 6 illustrates a state after a first dielectric layer 1530 is formed on the core layer 1504, the die 1500, and the encapsulation layer 1510. The first dielectric layer 1530 may be a first photo imageable dielectric (PID) layer. The first dielectric layer 1530 is formed such that the first dielectric layer 1530 is coupled to a front side (e.g., active side) of the die 1500. The first dielectric layer 1530 may be formed on a passivation layer 1514 of the die 1500.

Stage 7 illustrates a state after a first interconnect 1532 (e.g., first redistribution interconnect) is formed on the first dielectric layer 1530. The first interconnect 1532 may be part of a first redistribution layer. A plating process may be used to form the interconnects.

Stage 8 illustrates a state after a second dielectric layer 1540 is formed on the first dielectric layer 1530 and/or the first interconnect 1532. The second dielectric layer 1540 may be a second photo imageable dielectric (PID) layer or a prepeg layer.

Stage 8 also illustrates a state after a second interconnect 1542 (e.g., second redistribution interconnect) is formed on the second dielectric layer 1540. The second interconnect 1542 is formed such that the second interconnect 1542 is coupled to the first interconnect 1532. The second interconnect 1542 may be part of a second redistribution layer. A plating process may be used to form the interconnects.

Figure 15C:
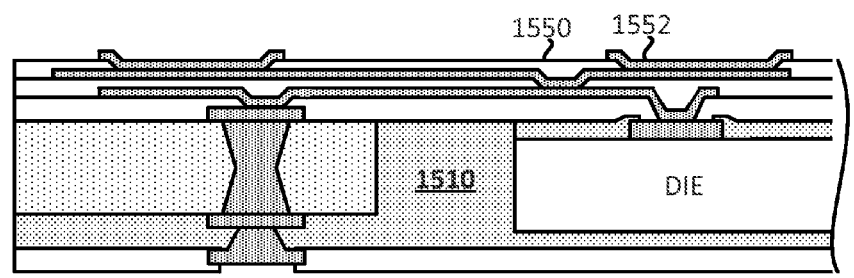
Figure 15C:
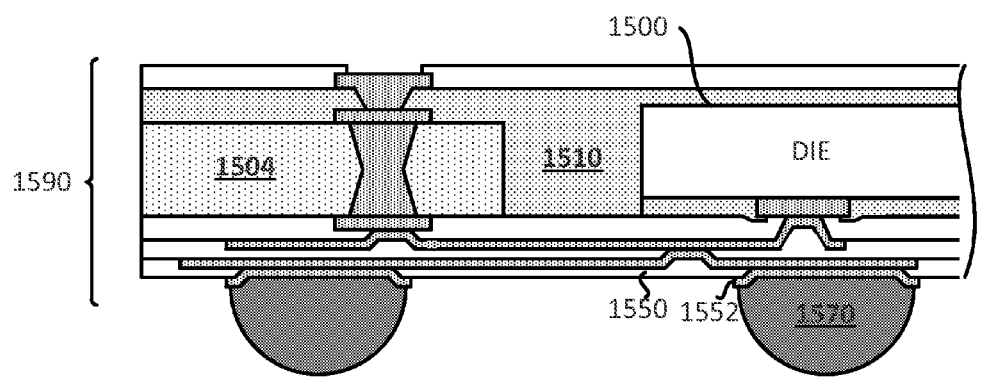

Stage 9, as shown in FIG. 15C, illustrates a state after a third dielectric layer 1550 is formed on the second dielectric layer 1540 and/or the second interconnect 1542. The third dielectric layer 750 may be a third photo imageable dielectric (PID) layer or a prepeg layer.

Stage 9 also illustrates a state after a third interconnect 1552 (e.g., under bump metallization (UBM) interconnect) is formed on the third dielectric layer 1550. The third interconnect 1552 is formed such that the third interconnect 1552 is coupled to the second interconnect 1542. A plating process may be used to form the interconnects. In some implementations, the first dielectric layer 1530, the first interconnect 1532, the second dielectric layer 1540, the second interconnect 1542, the third dielectric layer 1550, and the third interconnect 1552 may form a redistribution portion of a package.

Stage 10 illustrates a state after a solder ball 1570 is coupled to the third interconnect 1552. Stage 10 illustrates a package 1590 that includes the core layer 1504, the die 1500, the encapsulation layer 1510, the first dielectric layer 1530, the first interconnect 1532, the second dielectric layer 1540, the second interconnect 1542, the third dielectric layer 1550, and the third interconnect 1552. In some implementations, the package 1590 is a reinforced wafer level package that is implemented in a package on package (PoP) device. Examples of package on package (PoP) devices are described below in FIGS. 17-18.

Figure 16:
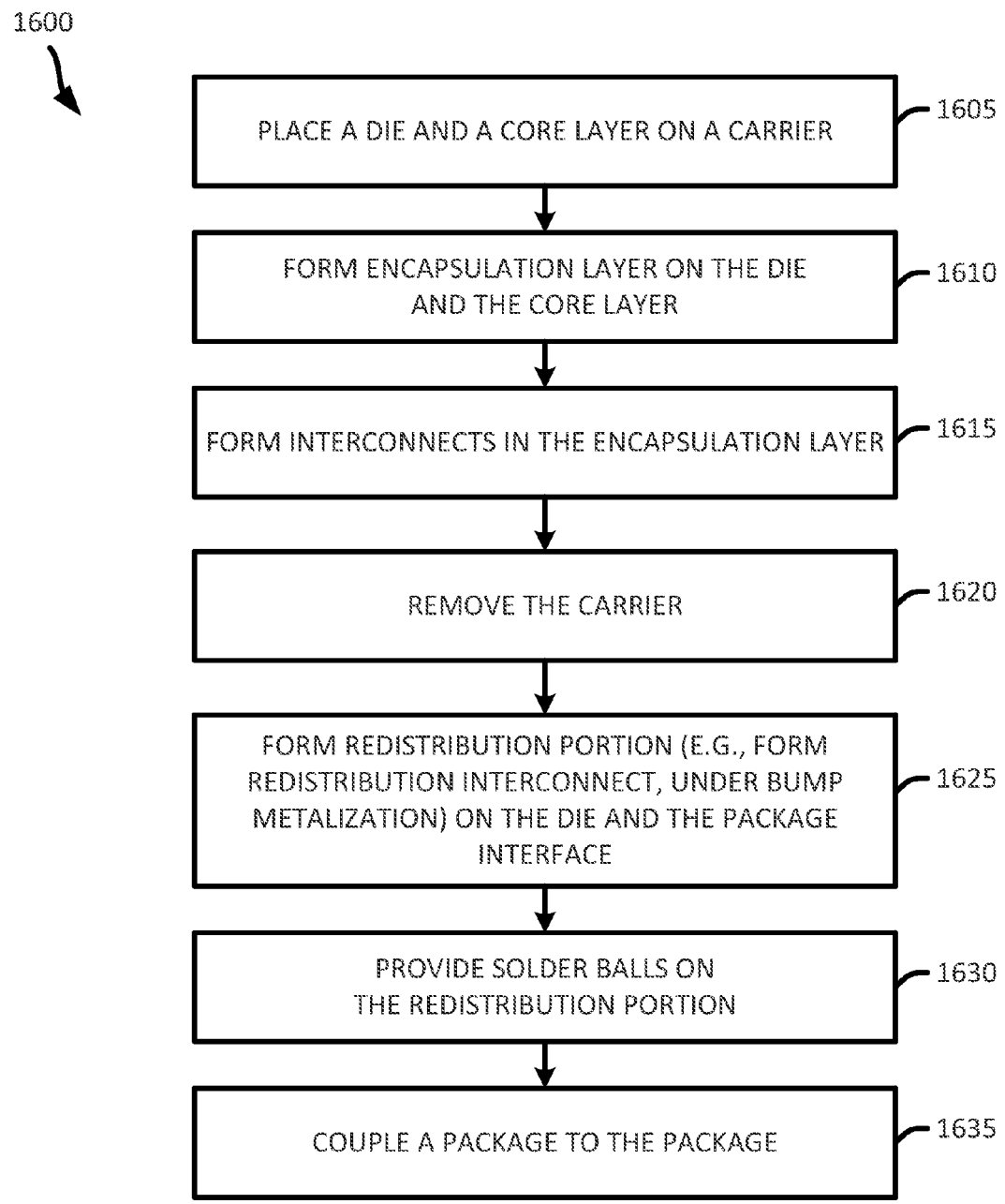
FIG. 16 illustrates an example of a flow diagram of a method for fabricating a package with a core layer comprising a via.

Exemplary Method for Fabricating a Reinforced Fan-Out Wafer Level Package Comprising a Core Layer In some implementations, providing/fabricating reinforced wafer level a package that includes a core layer includes several processes. FIG. 16 illustrates an exemplary flow diagram of a method for providing/fabricating an package on package (PoP) device that includes improved solder connection. In some implementations, the method of FIG. 16 may be used to provide/fabricate the packages of FIGS. 9-13 and/or other packages described in the present disclosure.

It should be noted that the flow diagram of FIG. 16 may combine one or more step and/or processes in order to simplify and/or clarify the method for providing a reinforced package. In some implementations, the order of the processes may be changed or modified.

The method places (at 1605) a die and a core layer on a carrier. The die may be a logic die and/or a memory die. The die may include a substrate portion (e.g., silicon substrate), a pad, and a first passivation layer. The core layer includes a via, a first pad and a second pad. In some implementations, several dies and/or electronic components (e.g., capacitor) may be placed on a carrier.

The method forms (at 1610) an encapsulation layer on the die and the core layer. The encapsulation layer is formed such that the encapsulation layer at least partially encapsulates the die and the core layer.

The method forms (at 1615) at least one interconnect in the encapsulation layer. The interconnects may be encapsulation interconnects. In some implementations, forming the interconnect in the encapsulation layer comprises a plating process.

The method then decouples (at 1620) (e.g., detaches, removes) the carrier from the die, the core layer, and the encapsulation layer.

The method forms (at 1625) a redistribution portion on the die and the core layer. In some implementations, forming the redistribution portion includes forming a first dielectric layer, first interconnect, a first redistribution layer (e.g., first redistribution interconnect), a second dielectric layer, a second interconnect, a second redistribution layer (e.g., second redistribution interconnect), a third dielectric layer and/or an under bump metallization (UBM) layer. One or more of the dielectric layers may be photo imageable dielectric (PID) layer and/or a prepeg layer.

The method couples (at 1630) a solder ball to the redistribution portion (e.g., coupling a solder ball to a UBM layer). The solder ball may be coupled to an interconnect, a UBM layer or a redistribution layer.

The method couples (at 1635) a first package to the package interconnect to form a package on package (PoP) device. In some implementations, a solder ball from the first package is coupled to the pad of the package.

Exemplary Package on Package (PoP) Devices

Figure 17:
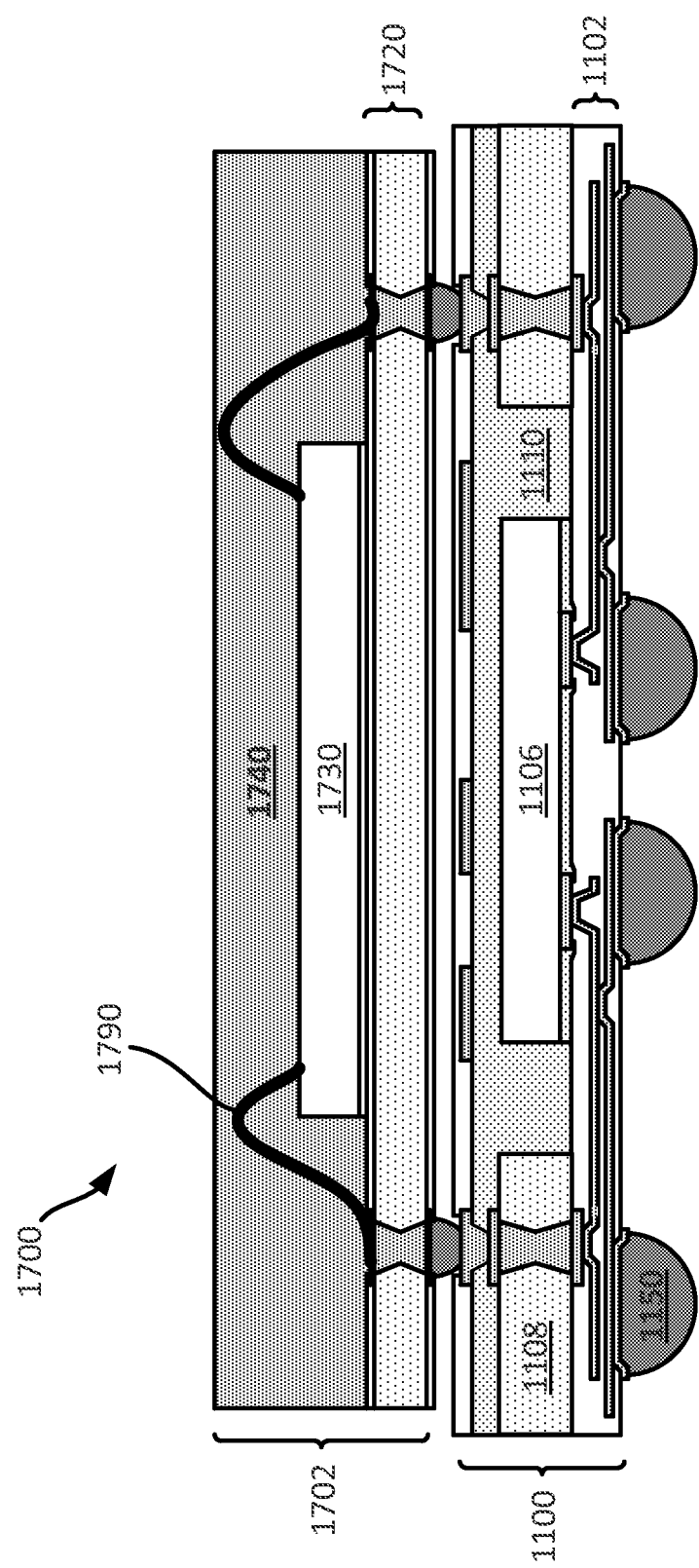
FIG. 17 illustrates an example of a package on package (POP) device.
Figure 18:
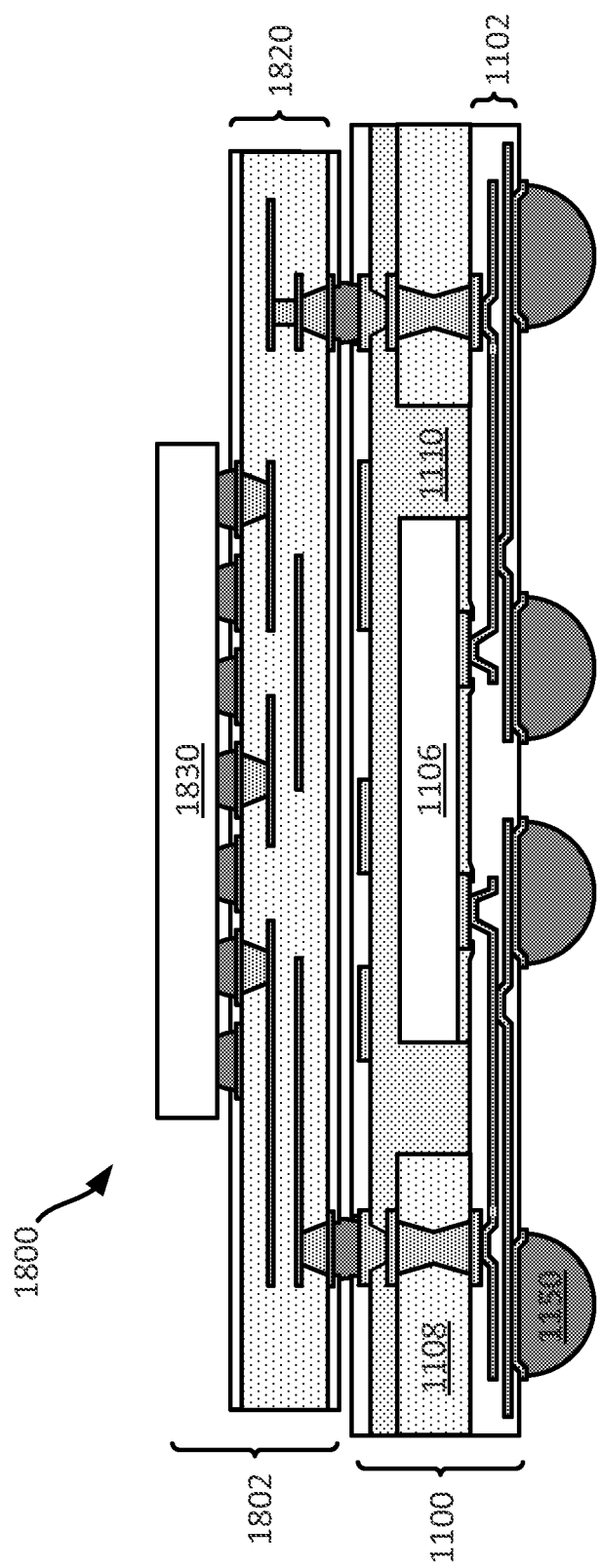
FIG. 18 illustrates an example of another package on package (POP) device.

Different implementations may use different packages in a package on package (PoP) device. For example, a first package (e.g., top package) of a package on package (PoP) device may include a fan-out wafer level package (FOWLP), a wire bond chip scale package, and/or a flip chip chip scale package. In some implementations, several top packages may be formed on a bottom package to form a package on package (PoP) device. FIGS. 17-18 illustrate examples of different package on package (PoP) devices with different package combinations. FIGS. 17-18 are merely examples of package on package (PoP) devices. A package on package (POP) device may utilize any of the packages described in the present disclosure.

FIG. 17 illustrates a package on package (PoP) device 1700 that includes a first package 1702 (e.g., first integrated circuit device package) and the package 1100 (e.g., second package), where the first package 1702 is coupled to the package 1100. The first package 1702 includes a first package substrate 1720, a first die 1730, and an encapsulation layer 1740. The first die 1730 may be coupled to the first package substrate 1720 through an adhesive. The first package substrate 1720 includes a dielectric layer, a first solder resist layer, a second solder resist layer, a first pad, and a first via. The wire bond 1790 is coupled to the first die 1730 and the package substrate 1720.

FIG. 18 illustrates a package on package (PoP) device 1800 that includes a first package 1802 (e.g., first integrated circuit device package) and the package 1100, where the first package 1802 is coupled to the package 1100. The first package 1802 includes a first package substrate 1820 and a first die 1830. The first die 1830 may be coupled to the first package substrate 1820 through solder balls. The first package substrate 1820 includes a dielectric layer, a first solder resist layer, and interconnects (e.g., pads, traces, vias). The first die 1106 may be a flip chip die.

Exemplary Reinforced Fan-Out Wafer Level Packages

Figure 19:
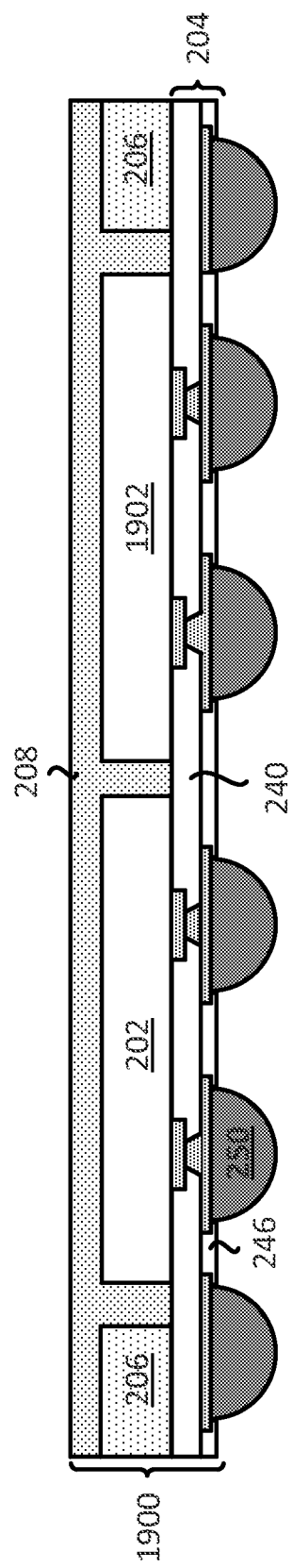
FIG. 19 illustrates an example of a package with a core layer and multiple electronic components.
Figure 20:
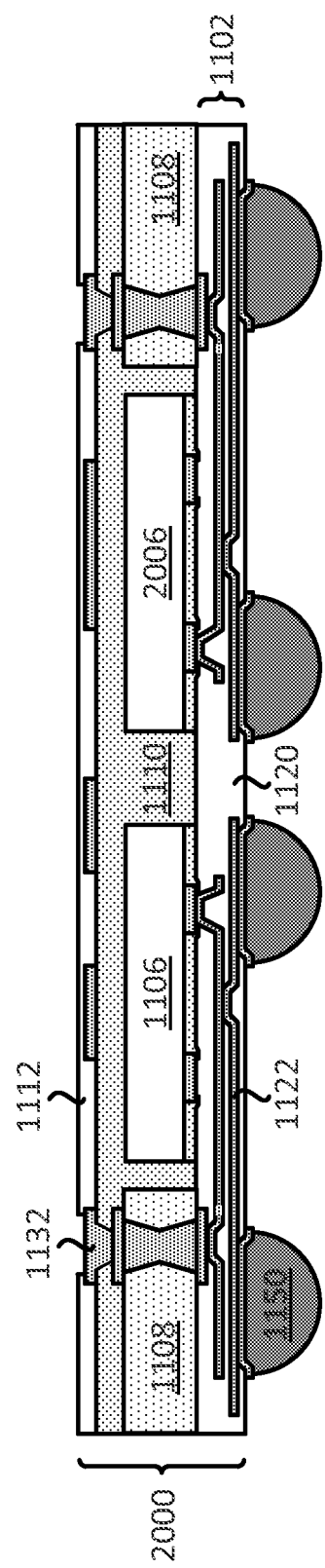
FIG. 20 illustrates an example of a package with a core layer and multiple electronic components.

In some implementations, a reinforced fan out wafer level package may include more than one electronic component (e.g., more than one die, a die and a capacitor). FIGS. 19-20 illustrate examples of different packages with multiple electronic components.

FIG. 19 illustrates a package 1900 includes a first die 202, a second component 1902, a redistribution portion 204, a core layer 206, and an encapsulation layer 208. In some implementations, the package 1900 is similar to the package 200, except that the package 1900 includes the second component 1902 (e.g., electronic component). The second component 1902 may be a second die. The second component 1902 may be an electronic component such as a capacitor (e.g., multi-layer ceramic capacitor (MLCC)).

FIG. 20 illustrates a package 2000 that includes a redistribution portion 1102, a first die 1106, a second component 2006, a core layer 1108, an encapsulation layer 1110, and a solder resist layer 1112. The redistribution portion 1102 includes at least one dielectric layer 1120 and several interconnects 1122 (e.g., redistribution interconnects, under bump metallization (UBM) interconnects). In some implementations, the package 2000 is similar to the package 1100, except that the package 2000 includes the second component 2006 (e.g., electronic component). The second component 2006 may be a second die. The second component 2106 may be an electronic component such as a capacitor (e.g., multi-layer ceramic capacitor (MLCC)).

In some implementations, the process of including the second component (e.g., second component 1902, second component 2006) is similar to including the first die, as described in FIGS. 6-8 and/or 14-16.

The packages described above may be implemented in any of the package on package (PoP) devices described in the present disclosure.

Exemplary Electronic Devices

Figure 21:
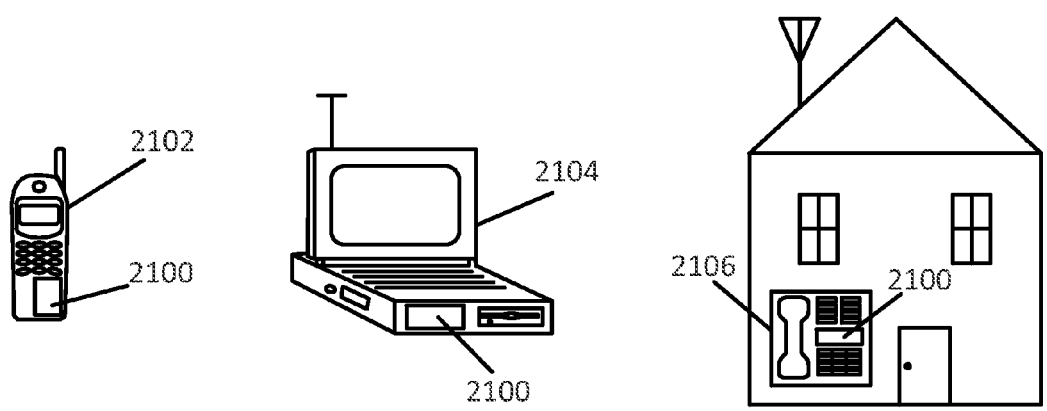
FIG. 21 illustrates various electronic devices that may integrate an integrated device, an integrated device package, a semiconductor device, a die, an integrated circuit, a substrate, an interposer, a package-on-package device, and/or PCB described herein.

FIG. 21 illustrates various electronic devices that may be integrated with any of the aforementioned integrated device, semiconductor device, integrated circuit, die, interposer, package or package-on-package (PoP). For example, a mobile phone device 2102, a laptop computer device 2104, and a fixed location terminal device 2106 may include an integrated device 2100 as described herein. The integrated device 2100 may be, for example, any of the integrated circuits, dies, integrated devices, integrated device packages, integrated circuit devices, package-on-package devices described herein. The devices 2102, 2104, 2106 illustrated in FIG. 21 are merely exemplary. Other electronic devices may also feature the integrated device 2100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

One or more of the components, steps, features, and/or functions illustrated in FIGS. 2, 3, 4, 5, 6A-6B, 7A-7C, 8, 9, 10, 11, 12, 13, 14A-14C, 15A-15C, 16, 17, 18, 19, 20 and/or 21 may be rearranged and/or combined into a single component, step, feature or function or embodied in several components, steps, or functions. Additional elements, components, steps, and/or functions may also be added without departing from the disclosure. It should also be noted that FIGS. 2, 3, 4, 5, 6A-6B, 7A-7C, 8, 9, 10, 11, 12, 13, 14A-14C, 15A-15C, 16, 17, 18, 19, 20 and/or 21 and its corresponding description in the present disclosure is not limited to dies and/or ICs. In some implementations, FIGS. 2, 3, 4, 5, 6A-6B, 7A-7C, 8, 9, 10, 11, 12, 13, 14A-14C, 15A-15C, 16, 17, 18, 19, 20 and/or 21 and its corresponding description may be used to manufacture, create, provide, and/or produce integrated devices. In some implementations, a device may include a die, an integrated device, a die package, an integrated circuit (IC), an integrated device package, a wafer, a semiconductor device, a package on package (PoP) device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

A 'set' of objects may include one or more objects. For example, a set of solder balls may include one or more solder balls. A 'set' of interconnects may include one or more interconnects. A set of solder joint structures may include one or more solder joint structures. A set of pads may include one or more pads. The term "encapsulate" and/or "encapsulation" may mean partial encapsulation or complete encapsulation of an object.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package comprising:
    a redistribution portion comprising:
        a first photo imageable dielectric (PID) layer; and
        a first interconnect, wherein the first interconnect comprises a first via in the first photo imageable dielectric (PID) layer, wherein the first via comprises a diameter of about 30 ($\mu$m) microns or less;
    a first die comprising a pad, the first die coupled to the redistribution portion, wherein the first die is coupled to the first interconnect of the redistribution portion such that the pad is directly touching the first interconnect of the redistribution portion;
    a core layer coupled to the redistribution portion; and
    an encapsulation layer encapsulating the first die and the core layer.

2. The package of claim 1, wherein the core layer has a first Young's Modulus, and the encapsulation layer has a second Young's Modulus, wherein the first Young's Modulus is greater than the second Young's Modulus.

3. The package of claim 2, wherein the first Young's Modulus is about at least 15 gigapascals (Gpa) or greater.

4. The package of claim 2, wherein the second Young's Modulus is less than about 15 gigapascals (Gpa).

5. The package of claim 1, wherein the core layer comprises a glass fiber.

6. The package of claim 1, wherein the first die comprises a front side and a back side, wherein the front side of the first die is coupled to the redistribution portion.

7. The package of claim 1, wherein the encapsulation layer has a coefficient of thermal expansion (CTE) in the range of about 20-50 parts per million per degree Celsius (ppm/C).

8. The package of claim 1, wherein the core layer has a coefficient of thermal expansion (CTE) that is less than about 12 parts per million per degree Celsius (ppm/C).

9. The package of claim 1, wherein the package is a fan-out wafer level package.

10. The package of claim 1, wherein the core layer includes a via.

11. The package of claim 1, wherein the encapsulation layer comprises an encapsulation interconnect.

12. The package of claim 1, wherein the package is integrated in a package on package (PoP) device, the package on package (PoP) device comprising a second package.

13. The package of claim 12, wherein the second package is a package from a group of packages comprising a fan-out wafer level package (FOWLP), a wire bond chip scale package (CSP), and/or a flip chip chip scale package (CSP).

14. The package of claim 1, wherein the package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle, and further including the device.

15. The package of claim 1, wherein the pad of the first die is coupled to the first interconnect of the redistribution portion such that a coupling between the pad and the first interconnect is free of solder.

16. The package of claim 1, wherein the first interconnect is an interconnect from a plurality of interconnects formed in the redistribution portion, the plurality of interconnects comprising a pitch of about 30 (μm) microns or less.

17. A package on package (PoP) device comprising:
a first package; and
a second package coupled to the first package, the second package comprising
a redistribution portion comprising:
a first photo imageable dielectric (PID) layer; and
a first interconnect, wherein the first interconnect comprises a first via in the first photo imageable dielectric (PID) layer, wherein the first via comprises a diameter of about 30 (μm) microns or less;
a first die comprising a pad, the first die coupled to the redistribution portion, wherein the first die is coupled to the first interconnect of the redistribution portion such that the pad is directly touching the first interconnect of the redistribution portion;
a core layer coupled to the redistribution portion;
a via traversing the core layer;
an encapsulation layer encapsulating the first die and the core layer; and
a second interconnect in the encapsulation layer, wherein the second interconnect is coupled to the via.

18. The package on package (PoP) device of claim 17, wherein the second interconnect is a second via in the encapsulation layer, wherein the second via has a diameter of about 40 (μm) microns or greater.

19. The package on package (PoP) device of claim 17, wherein the second package is a fan-out wafer level package.

20. The package on package (PoP) device of claim 17, wherein the first package is a package from a group of packages comprising a fan-out wafer level package (FOWLP), a wire bond chip scale package (CSP), and/or a flip chip chip scale package (CSP).

21. The package on package (PoP) device of claim 17, wherein the redistribution portion further comprises a second dielectric layer, wherein the second dielectric layer is made of a same material as the encapsulation layer, wherein the first photo imageable dielectric (PID) layer is between the encapsulation layer and the second dielectric layer.

22. The package on package (PoP) device of claim 17, wherein the pad of the first die is coupled to the first interconnect of the redistribution portion such that a coupling between the pad and the first interconnect is free of solder.

23. The package on package (PoP) device of claim 17, wherein the first interconnect is an interconnect from a plurality of interconnects formed in the redistribution portion, the plurality of interconnects comprising a pitch of about 30 (μm) microns or less.

* * * * *